(12) United States Patent
Imoto et al.

(10) Patent No.: US 8,823,097 B2
(45) Date of Patent: Sep. 2, 2014

(54) PROTECTION DEVICE WITH A THIN-FILM RESISTANCE CONNECTED TO PLURAL DRAIN REGIONS

(75) Inventors: Tsutomu Imoto, Kanagawa (JP); Toshio Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 654 days.

(21) Appl. No.: 12/621,164

(22) Filed: Nov. 18, 2009

(65) Prior Publication Data
US 2010/0140713 A1 Jun. 10, 2010

(30) Foreign Application Priority Data

Dec. 4, 2008 (JP) ................................ 2008-310188

(51) Int. Cl.
| | |
|---|---|
| H01L 27/06 | (2006.01) |
| H01L 29/8605 | (2006.01) |
| H01L 29/78 | (2006.01) |
| H01L 29/735 | (2006.01) |
| H01L 27/02 | (2006.01) |
| H01L 29/66 | (2006.01) |
| H01L 29/73 | (2006.01) |
| H01L 29/08 | (2006.01) |

(52) U.S. Cl.
CPC ........ *H01L 29/8605* (2013.01); *H01L 29/7835* (2013.01); *H01L 29/735* (2013.01); *H01L 27/0277* (2013.01); *H01L 29/66659* (2013.01); *H01L 29/7304* (2013.01); *H01L 29/0847* (2013.01); *H01L 29/0821* (2013.01)
USPC ........................................ 257/341

(58) Field of Classification Search
USPC .......... 257/355, 360–362, E27.033, E27.112, 257/E29.255, 328, 341, E29.03
See application file for complete search history.

(56) References Cited

U.S. PATENT DOCUMENTS

| | | | |
|---|---|---|---|
| 6,271,552 B1* | 8/2001 | D'Anna | 257/288 |
| 6,777,723 B1* | 8/2004 | Narita | 257/173 |
| 7,268,398 B1* | 9/2007 | Vashchenko et al. | 257/355 |

FOREIGN PATENT DOCUMENTS

| | | |
|---|---|---|
| JP | 2002-009281 | 1/2002 |
| JP | 2007-335463 | 12/2007 |

OTHER PUBLICATIONS

Mergens et al., "Diode-Triggered SCR (DTSCR) for RF-ESD Protection of BICMOS Si Ge HBTs and CMOS Ultra-Thin Gate Oxides", IEDM vol. 3, pp. 515-518, 2003.

* cited by examiner

*Primary Examiner* — Thomas L Dickey
(74) *Attorney, Agent, or Firm* — Sony Corporation

(57) ABSTRACT

A transistor-type protection device includes: a semiconductor substrate; a well of a first-conductivity-type formed in the semiconductor substrate; a source region of a second-conductivity-type formed in the well; a gate electrode formed on the well via a gate insulating film at one side of the source region; plural drain regions of a second-conductivity-type formed apart from each other and respectively separated at a predetermined distance from a well part immediately below the gate electrode film; and a resistive connection part connecting between the plural drain regions with a predetermined electric resistance.

12 Claims, 15 Drawing Sheets

→ ESD PATH

<FIRST EMBODIMENT>

<COMPARATIVE EXAMPLE(DE-MOS Tr)>

<COMPARATIVE EXAMPLE(DE-MOS Tr)>

<THIRD EMBODIMENT>

<FOURTH EMBODIMENT>

TRm

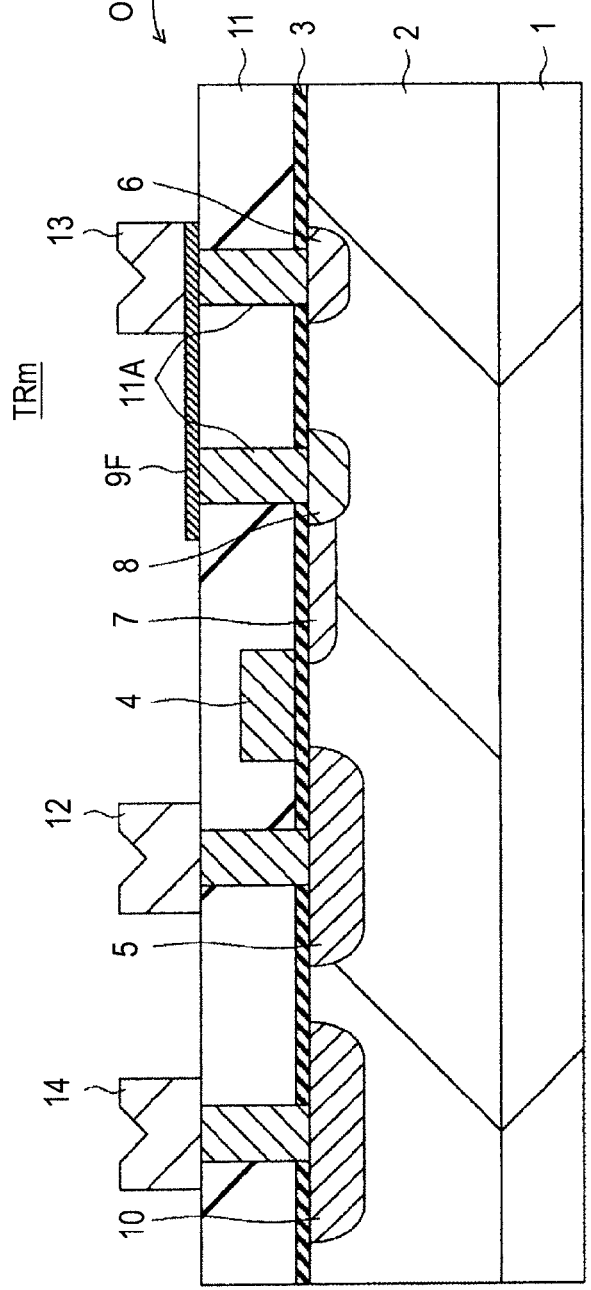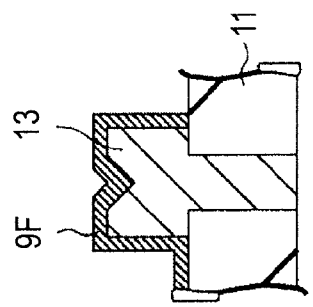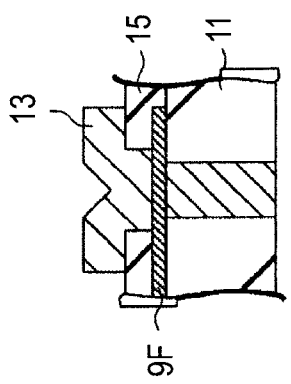

PROTECTION DEVICE WITH A THIN-FILM RESISTANCE CONNECTED TO PLURAL DRAIN REGIONS

The present application claims priority to Japanese Patent Application JP 2008-310188 filed in the Japan Patent Office on Dec. 4, 2008, the entire contents of which is hereby incorporated by reference.

BACKGROUND OF THE INVENTION

1. Field of the Invention

The present invention relates to a transistor-type protection device that can be turned on and remove noise when noise at a predetermined or higher level is superimposed on wiring of a connected circuit. Further, the present invention relates to a semiconductor integrated circuit in which the transistor-type protection device and a circuit to be protected are integrated on the same substrate.

2. Description of Relate Art

Generally, a semiconductor integrated circuit includes a protection circuit for electrostatic discharge (ESD) for protecting an internal circuit from static electricity entering from an external terminal.

The protection circuit connects an ESD protection device between wires where static electricity tends to be superimposed like that between the power supply line and the GND line of the internal circuit.

As the ESD protection device, typically, a GGMOS (Gate-Grounded MOSFET) using a MOSFET forming the internal circuit or thyristor is used.

An example of the protection device using a GGMOS is disclosed in JP-A-2002-9281. Further, an example of the protection device using a thyristor is disclosed in M. P. J. Mergens et al., "Diode-Triggered SCR (DTSCR) for RF-ESD Protection of BICMOS SiGe HBTs and CMOS Ultra-Thin Gate Oxides", in IEDM' 03 Tech. Digest, pp. 21.3.1-21.3.4, 2003.

An advantage of using a thyristor as the protection device is that the on-resistance is low. Accordingly, the thyristor is suitable for protection of small low-withstand-voltage micro MOSFET. Further, the thyristor is suitable for flowing large current because it can secure a large sectional area of current path.

However, the thyristor has a disadvantage of having a high trigger voltage. If the trigger voltage is high, the internal circuit is broken before the thyristor is turned on.

On this account, various proposals have been made for reducing the trigger voltage.

For example, M. P. J. Mergens et al. discloses an example of a technology using forward current of PN junction. If the technology is applied, the trigger voltage and the hold voltage can be controlled by the number of diodes and the design of the protection device is easy.

However, in the technology disclosed in M. P. J. Mergens et al., the diodes are constantly biased forward, and the statistic leak current is large. The leak current is sensitive to the device temperature and rapidly increases with rise of the device temperature.

Further, in the technology disclosed in M. P. J. Mergens et al., if the number of diodes is reduced for obtainment of the low trigger voltage, the leak current is increased. Accordingly, it may be impossible to use the technology for the application with severe restrictions on power consumption.

On the other hand, the protection circuit using a GGMOS is formed with elongated wiring within the integrated circuit (IC) between the power supply voltage line and the GND line where electrostatistic noise tends to be superimposed as shown in FIG. 1 of JP-A-2002-9281. Here, each of a PMOS transistor and an NMOS transistor of the same type as the inverter of the internal circuit has a GGMOS configuration and series-connected between the VDD line and the GND line.

In FIGS. 3 and 14 of JP-A-2002-9281, sectional structure diagrams of a GGMOSFET are shown.

According to the description of JP-A-2002-9281, there is a low-density semiconductor region led out to the outside of a side wall spacer from a gate electrode in a gate length direction. In JP-A-2002-9281, signs "(7b, 8b)" indicate the low-density semiconductor region. The low-density semiconductor region is formed to be a non-silicide region.

According to the description of JP-A-2002-9281, if the low-density semiconductor region is non-silicided, the higher diffusion resistance than that in the case where a high-density semiconductor region is non-silicided is obtained. When a carrier path is secured by the high diffusion resistance, a current path S1 is produced from the LDD end (low-density semiconductor region end) to the source side. Then, the current beyond the flow in the current path S1 is allowed to flow in a new current path S2 starting from a drain region at high impurity density to the source side. Thereby, current is distributed and the resistance to electrostatic breakdown of the GGMOS is improved.

SUMMARY OF THE INVENTION

In the MOS transistor-type protection device disclosed in the above described JP-A-2002-9281, an N-type impurity region (resistive breakdown region) functioning as a resistance layer when the device itself causes junction breakdown overlaps with the gate electrode on a pattern. Accordingly, there are many restrictions on the drain withstand voltage and it is difficult to realize the higher withstand voltage.

More specifically, in the structure of JP-A-2002-9281, the drain withstand voltage is restricted by all of the punch-through withstand voltage between the source and the drain, the junction withstand voltage between the drain and the well, and the insulating film withstand voltage between the gate and the drain. Accordingly, it is very difficult to set the drain withstand voltage having an appropriate amplitude for the withstand voltage of the internal circuit to be protected by the MOS transistor-type protection device.

In the protection device disclosed in JP-A-2002-9281, a resistive breakdown region is formed by two low-density impurity regions and a high-density impurity region between them as a whole. However, the high-density impurity region is silicided, and the resistance value varies to some degree in the part. Further, the part on the high-density impurity region including the drain region is silicided, and the silicided is near breakdown points. Since the heat generation locations are near the silicide layer, it may be highly possible that defects of breakage of the part and change in the resistance value of the silicide, or the like occur.

Further, when four of the high-density impurity regions and the low-density impurity regions are alternately formed as in JP-A-2002-9281, the area penalty is great.

Thus, it is desirable to provide a transistor-type protection device for which a turn-on voltage can be freely set optimally for a circuit to be protected with less restrictions on determination of the turn-on voltage (protection voltage) of the protection device.

Further, it is desirable to provide a semiconductor integrated circuit formed by integrating such a transistor-type protection device with the circuit to be protected.

A transistor-type protection device according to an embodiment of the invention has a semiconductor substrate, a well of a first-conductivity-type formed in the semiconductor substrate, and a source region, a gate electrode, plural drain regions, and a resistive connection part formed with respect to the well.

The source region is of a second-conductivity-type formed in the well.

The gate electrode is formed on the well via a gate insulating film at one side of the source region.

The plural drain regions are of a second-conductivity-type. The respective plural drain regions are apart from each other and respectively separated at a predetermined distance from a well part immediately below the gate electrode film.

The resistive connection part connects between the plural drain regions with a predetermined electric resistance.

In the embodiment of the invention, preferably, the resistive connection part is a second-conductivity-type semiconductor region having a metallurgical junction form and an impurity concentration profile determined so that a region not depleted at application of a drain bias when junction breakdown occurs in one of the plural drain regions may remain. Such a case where the resistive connection part is the second-conductivity-type semiconductor region is referred to as "one preferred embodiment".

Alternatively, preferably, the resistive connection part includes at least one thin-film resistance connected to the respective plural drain regions via a contact part. Such a case where the resistive connection part includes the thin-film resistance is referred to as "another preferred embodiment".

According to the configuration, a predetermined drain bias is applied to, for example, one of the plural drain regions with reference to the potential of the source region (the well can be made at the same potential). As the drain bias is made larger, the depleted layer extends in both depth directions from the metallurgical junction location between each of the plural drain regions and the well.

In the one preferred embodiment, concurrently, the depleted layer also extends in both depth directions from the metallurgical junction location between the second-conductivity-type semiconductor region as the resistive connection part and the well. Then, junction breakdown occurs at a certain drain bias in one of the plural drain regions.

When junction breakdown once occurs, current flows from the drain region where the junction breakdown occurs to the source region. Thereby, the well potential rises and PN junction between the well and the source region is biased forward. Afterwards, a parasitic bipolar transistor with the source region, well, and plural drain regions or resistive breakdown region as an emitter, base, collector, respectively, is turned on.

When the parasitic bipolar transistor is turned on, the impedance between the emitter and the collector rapidly becomes lower and current flows at the well surface side with reduced impedance.

In the one preferred embodiment, the metallurgical junction form and the impurity concentration profile are determined so that the region not depleted may remain in the second-conductivity-type semiconductor region as the resistive connection part when the junction breakdown first occurs. Accordingly afterwards, in the process in which the drain bias becomes larger, the resistive breakdown region functions as a resistance layer in the same manner as before.

On the other hand, a thin-film resistance is provided in the another preferred embodiment, and whether the region functions as a resistance layer or not is independent of the magnitude of the drain bias. That is, in the another preferred embodiment, the thin-film resistance constantly functions as a resistance layer.

In either embodiment, the carrier path when the next junction breakdown occurs is secured.

Accordingly, in the one preferred embodiment, the points where junction breakdown can occur are distributed in a wide range from the plural drain regions to the second-conductivity-type semiconductor region of the resistive connection part connecting between them.

On the other hand, in the another preferred embodiment, the points where junction breakdown can occur are distributed in the plural drain regions.

Here, the drain region where the first junction breakdown (here, avalanche breakdown is taken as an example of junction breakdown) occurs is conveniently referred to as "first breakdown region".

When avalanche breakdown occurs in the first breakdown region, emitter current injected in the parasitic bipolar operation is collected to the drain region nearer the emitter (source region). When the device property is snapped back because of the bipolar operation, the drain voltage (collector voltage) becomes lower. Accordingly, the avalanche breakdown becomes weaker in the first breakdown region (collector region). Instead, electrons injected from the source region are accelerated in another drain region than the first breakdown region (hereinafter, referred to as "second breakdown region) and cause avalanche breakdown. Accordingly, the avalanche breakdown becomes stronger in the second breakdown region.

Since the potential is determined with reference to the source region, the current that contributes to the above two-step avalanche breakdown flows through the resistive connection part that functions as a ballast resistance. Accordingly, the potential of the second breakdown region is raised by the amount of voltage drop calculated from the current and the resistance value. Therefore, junction breakdown becomes easier to occur again in the second breakdown region where the potential is raised. As a result, junction breakdown occurs in both the first drain region and the second drain region.

In the case of three or more drain regions, the drain region where the avalanche breakdown is stronger changes one after another in a chain reaction.

As a result of distribution of the junction breakdown points, points where the temperature rise due to current are distributed in a wide range.

In the embodiment, the turn-on voltage at which large current effective for noise removal starts to flow in the protection device because of the bipolar operation is determined depending on the junction forms and the impurity concentration profiles of the plural drain regions. Especially, in the one preferred embodiment, further, the turn-on voltage is also determined depending on the junction form and the impurity concentration profile of the second-conductivity-type semiconductor as the resistive connection part. Therefore, a more versatile and easy-to-use protection device can be realized with reduced restrictions on the turn-on voltage as much as possible.

In the embodiment, the source side ends of the respective drain regions are at the predetermined distance apart from the well part immediately below the gate electrode. Accordingly, when the turn-on voltage is determined while securing the withstand voltage between the gate and the drain, there is no constriction due to the withstand voltage and the turn-on voltage can be freely designed by just that much.

The embodiment is also applied to a bipolar transistor type protection device and an integrated circuit.

According to the embodiments of the invention, there is provided a transistor-type protection device for which the turn-on voltage can be freely set optimally for a circuit to be protected with less restrictions on determination of the turn-on voltage (protection voltage) of the protection device.

Further, according to the embodiments of the invention, there is provided a semiconductor integrated circuit formed by integrating such a transistor-type protection device with the circuit to be protected.

BRIEF DESCRIPTION OF THE DRAWINGS

FIGS. 15A, 15B1, and 15B2 are sectional structure diagrams of a MOS transistor-type protection device related to the fifth embodiment.

DESCRIPTION OF PREFERRED EMBODIMENTS

Embodiments of the invention will be described as examples with reference to the drawings.

As below, the explanation will be made in the following order.

1. First Embodiment (MOS-type: a drain structure with an electric field relaxation region, including a manufacturing method and comparison with a comparative example)

2. Second Embodiment (MOS-type: an electric field relaxation region is omitted from the drain structure of the first embodiment)

3. Third Embodiment (bipolar type: a gate electrode is omitted from the structure of the first embodiment)

4. Fourth Embodiment (MOS-type: a low-density region at the source side is added to the structure of the first embodiment)

5. Fifth Embodiment (MOS-type: a resistive connection part is formed by a wiring layer)

6. Modified Examples

First Embodiment

Application Example of Protection Circuit

Figure 1A:
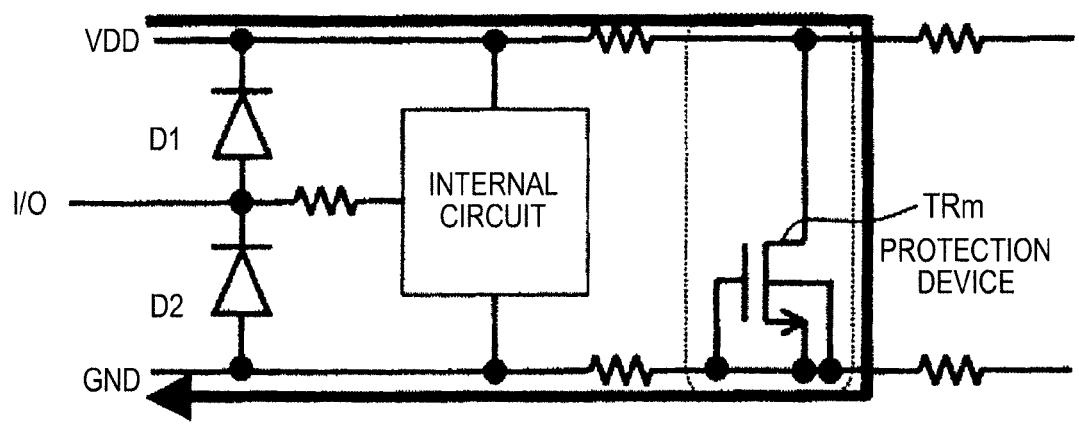
FIGS. 1A and 1B are circuit block diagrams showing an application example of a protection circuit using a protection device related to the first to fifth embodiments.
Figure 1B:
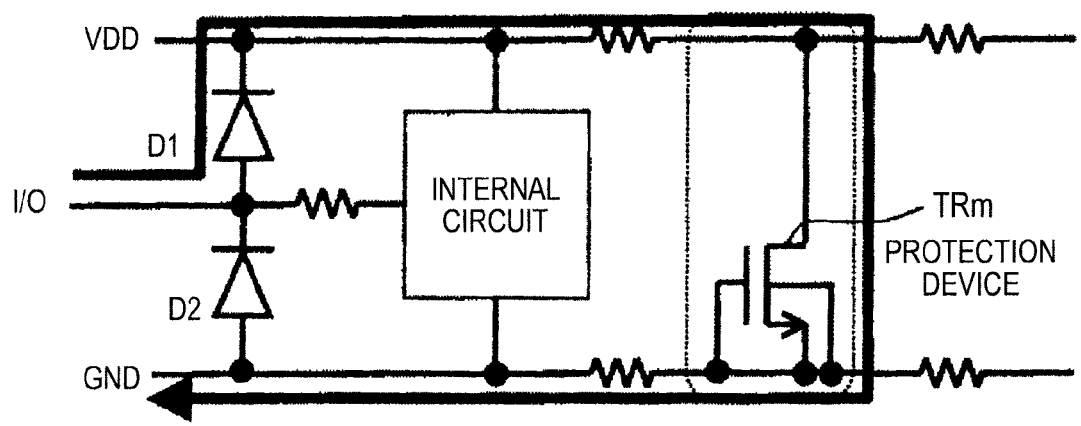

FIGS. 1A and 1B show an application example of a protection circuit using a protection device related to the first to fifth embodiments.

The protection circuit (parts surrounded by broken lines) illustrated in FIGS. 1A and 1B is a circuit for protecting an internal circuit and includes one NMOS transistor in this example. The transistor forming the protection circuit may be a PMOS transistor. Note that, the NMOS transistor is desirable for the protection device of the protection circuit because of its current drive performance.

Such a MOS transistor-type protection device is noted by a sign "TRm".

The protection device may be an external discrete component to an integrated circuit (IC) containing the internal circuit, however, here, the protection circuit and the internal circuit are integrated on a common semiconductor substrate. Accordingly, the configuration shown in FIGS. 1A and 1B corresponds to "semiconductor integrated circuit" of one embodiment of the invention. Further, the MOS transistor-type protection device TRm corresponds to "transistor-type protection device" of one embodiment of the invention.

The MOS transistor-type protection device TRm has a drain connected to a supply line of a power supply voltage VDD and a source connected to a GND line. A gate of the MOS transistor-type protection device TRm is connected to the GND line. Accordingly, the MOS transistor in the connection configuration is called a GG (Gate-Grounded) MOS transistor.

The internal circuit is connected between the supply line of the power supply voltage VDD and the GND line. Accordingly, the internal circuit is driven by the power supply voltage VDD.

In FIGS. 1A and 1B, an input line or output line of signals (hereinafter, collectively referred to as a signal line) from an input/output circuit or input/output terminal noted by a sign "I/O" (not shown) is connected to the internal circuit.

Noise due to static electricity or the like may be superimposed on the signal line. Accordingly, a protection diode D1 with an anode at the signal line side is connected between the signal line and the power supply voltage VDD. Further, a protection diode D2 with an anode at the GND line side is connected between the signal line and the GND line.

Note that GGMOS transistors to which the invention is applied may be added in place of the protection diodes D1, D2.

FIG. 1A is an operational explanatory diagram of the protection circuit when a surge of positive charge enters a power supply terminal.

When a surge of positive charge enters the supply line of the power supply voltage VDD from a power supply terminal or the like (not shown), the potential of the supply line of the power supply voltage VDD rises due to the surge. Before the potential of the supply line of the power supply voltage VDD reaches the breakdown voltage of the internal circuit, the MOS transistor-type protection device TRm is turned on and turns to a conductive state. Accordingly, the surge escapes to the GND line through the MOS transistor-type protection device TRm.

FIG. 1B is an operational explanatory diagram of the protection circuit when a surge of positive charge enters an I/O terminal.

When a surge of positive charge enters the I/O terminal, the protection diode D1 is biased forward and turned on and allows the surge to flow into the supply line of the power supply voltage VDD. Then, the supply line of the power supply voltage VDD reaches a predetermined potential, the MOS transistor-type protection device TRm is turned on and turns to a conductive state. Accordingly, the surge escapes to the GND line through the MOS transistor-type protection device TRm. For protection of the internal circuit, it is necessary that the protection diode D1 is turned on before the potential exceeds the withstand voltage of input/output of the internal circuit. Further, it is necessary that the MOS transistor-type protection device TRm is turned on before the potential exceeds the (drain) withstand voltage of the transistor of the internal circuit.

Thereby, the internal circuit avoids breakage due to the high voltage.

As described above, the MOS transistor-type protection device TRm is necessary to fulfill the following requirements:

(1) having resistance to electrostatic breakdown not to be broken by the high voltage or large current generated by a surge;

(2) turned on at a voltage higher than the operation voltage of the internal circuit and less than the breakdown voltage of the internal circuit;

(3) having a sufficiently low impedance after turned on; and (4) having a sufficiently high impedance when not turned on.

[Device Structure]

Figure 2:
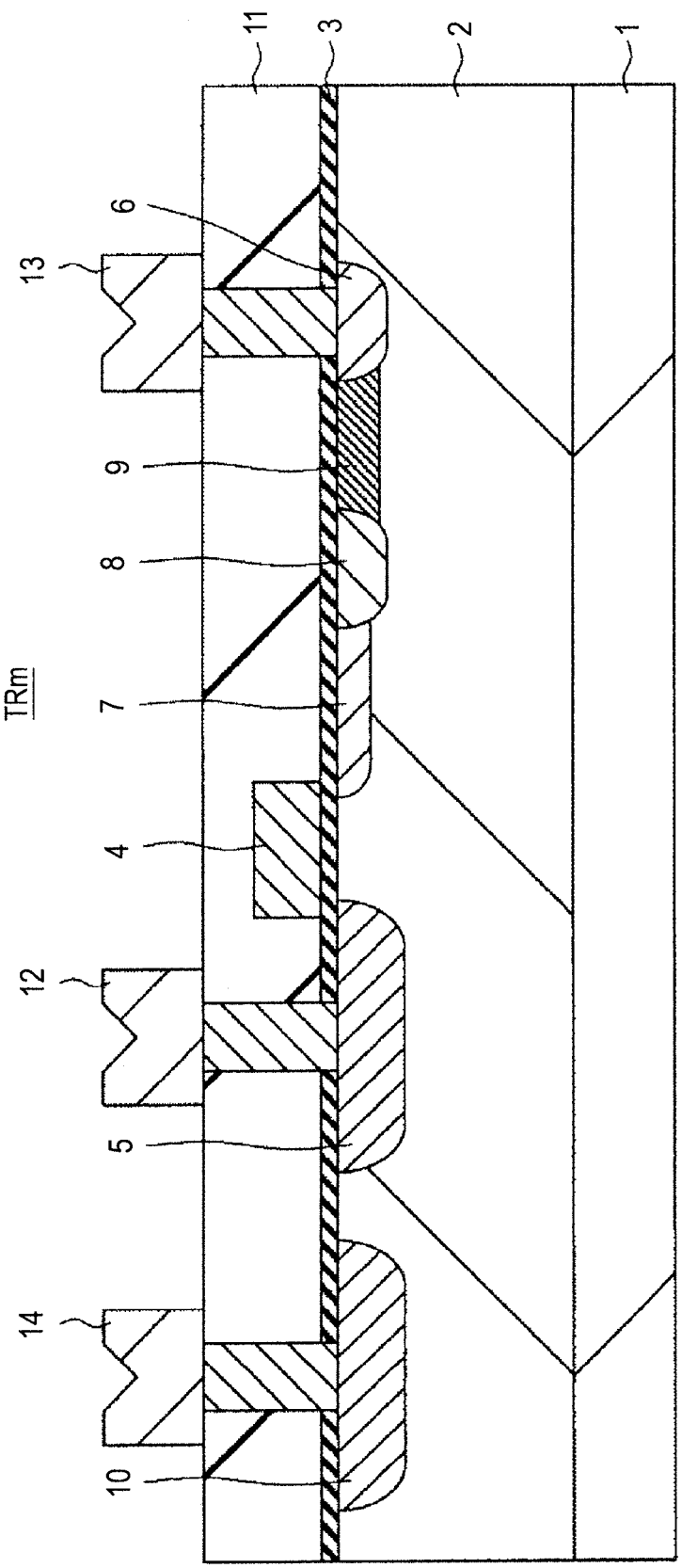
FIG. 2 is a sectional structure diagram of a MOS transistor-type protection device related to the first embodiment.

FIG. 2 is a sectional structure diagram of the MOS transistor-type protection device related to the first embodiment.

The MOS transistor-type protection device TRm is formed on a semiconductor substrate 1. The semiconductor substrate 1 is a P-type silicon (crystal plane orientation 100) substrate with an impurity doped at high density. A P-type well (hereinafter, referred to as "P-well") 2 with an impurity doped for obtainment of desired threshold voltages and withstand voltages of the respective parts is formed on the surface side within the semiconductor substrate 1.

On the surface of the P-well 2, a gate insulating film 3 of $SiO_2$ obtained by thermally oxidizing the surface of the semiconductor substrate 1 is formed.

On the gate insulating film 3, a gate electrode 4 of polysilicon with an N-type or P-type impurity doped is formed.

Although a plan view is not specifically shown, the gate electrode 4 has an elongated finger part. One side in the width direction of the finger part is a source and the other side is a drain.

More specifically, a source region 5 is formed by doping an N-type impurity at high density in the P-well 2 part at the one side of the gate electrode 4 (strictly, the finger part). A first drain region 6 and a second drain region 8 are formed apart from each other by doping an N-type impurity at high density as is the case of the source region 5 in P-well 2 part at the other side of the gate electrode 4 (finger part).

Here, the edge of the source region 5 reaches below the edge of the gate electrode 4 because of lateral diffusion of the impurity. The gate electrode 4 and the source region 5 partially overlap on a plane pattern.

On the other hand, the first drain region 6 and the second drain region 8 are respectively formed at a predetermined distance apart from the gate electrode 4. Accordingly, the first drain region 6 and the second drain region 8 do not overlap with the gate electrode 4 on the plane pattern.

More specifically, an electric field relaxation region 7, the second drain region 8, and a resistive connection region 9 are formed between the gate electrode 4 and the first drain region 6.

The electric field relaxation region 7 is an N-type impurity region that partially overlaps with the gate electrode 4 on the plane pattern as is the case of the source region 5. The electric field relaxation region 7 has density of the doped impurity substantially lower than that of the first and second drain region 6, 8, and is formed for the purpose of relaxing the lateral electric field like a so-called LDD region, extension, or the like. It is preferable that the electric field relaxation region 7 is depleted in the entire region in the depth direction at operation as will be described later. Accordingly, no junction breakdown occurs in the electric field relaxation region 7 in this case. In other words, the length of the electric field relaxation region 7 in the separation direction of the source and the drain and the impurity density of the electric field relaxation region 7 are determined so that the junction breakdown may not occur near the gate end.

The second drain region 8 is formed between the first drain region 6 and the electric field relaxation region 7. The resistive connection region 9 is formed between the first drain region 6 and the second drain region 8.

The impurity concentration distribution (impurity concentration profile) of the resistive connection region 9 is determined so that the pinch-off voltage may be higher than the drain breakdown voltage.

Here, the "pinch-off voltage of the resistive connection region 9" refers to a voltage applied to the first drain region 6 when the drain bias is changed and the depletion layer expands in the depth direction and the electrically neutral region disappears (is turned off) in the resistive connection region 9. The "disappearance (turned off) of the electrically neutral region" here means the first occurrence of disappearance in one or plural points of the second drain region 8.

Further, the "drain breakdown voltage" refers to the drain bias voltage when the junction breakdown first occurs in the first drain region 6 or the second drain region 8 in this example.

This requirement is equivalent to "the (electric neutral) region not depleted at application of the drain bias (e.g., drain voltage) when junction breakdown in the first drain region 6 or the second drain region 8 remains in the resistive connection region 9".

When the electrically neutral region remains, the resistive connection, region 9 functions as a resistance layer having appropriate sheet resistance.

The metallurgical junction form including the length, depth, etc. of the resistive connection region 9 in the separation direction of the source and the drain and the impurity concentration profile are determined so that the resistive connection region 9 may have a predetermined resistance value with the remaining electrically neutral region.

Here, when junction breakdown occurs in the order of the first drain region 6 and the second drain region 8, the upper limit of "predetermined resistance value" can be defined as below.

As the drain application voltage is raised, junction breakdown occurs in the first drain region 6, and, when the potential rise of the first drain region 6 is saturated, the electrically neutral region remains in the resistive connection region 9 and the predetermined resistance value is held. If the predetermined resistance value is too high, the drain application voltage is further raised and the electrically neutral region may disappear before the next junction breakdown occurs at a potential saturated but slightly higher. If so, the effective current path is cut off, and no junction breakdown occurs afterward in the second drain region 8. To prevent the situation, the upper limit of the predetermined resistance value is determined according to the metallurgical junction form and the impurity concentration profile of the resistive connection region 9.

The lower limit of "predetermined resistance value" is specified as below when junction breakdown occurs in the order of the second drain region 8 and the first drain region 6.

When junction breakdown first occurs in the first drain region 6 as described above, if the drain application voltage is raised, the potential of the first drain region 6 is raised little and saturated. On the other hand, when junction breakdown first occurs in the second drain region 8, voltage drop is caused in the resistive connection region 9 due to the immediate after drain current and the resistance value over the entire length of the resistive connection region 9. When positive noise is applied to the drain side, the potential of the respective impurity regions refers to the potential at the source side. Accordingly, when junction breakdown first occurs in the resistive connection region 9, the potential of the first drain region 6 is raised with reference to the potential at the source side. Here, if "predetermined resistance value" of the resistive connection region 9 is too small, the amount of voltage drop is too small, and the potential of the first drain region 6 is not raised to the potential at which junction breakdown occurs in a part of the first drain region 6.

That is, the lower limit of "predetermined resistance value" is necessary to be equal to or more than a resistance value that is sufficient to cause the next breakdown in the first drain region 6 after breakdown occurs first in the second drain region 8.

Note that the resistance value of the resistive connection region 9 is determined by a product of the sheet resistance and the length of the resistive connection region 9. These structure parameters are design factors depending on each other, and the optimum value of the resistance value of the resistive connection region 9 is not uniquely determined.

Furthermore, the junction depth of the resistive connection region 9 is made shallower than the junction depths of the first drain region 6 and the second drain region 8. Thereby, level differences of the metallurgical junction surfaces are respectively produced near the boundary between the resistive connection region 9 and the first drain region 6 and near the boundary between the resistive connection region 9 and the second drain region 8. Accordingly, corner curves are respectively formed at the substrate depth side of the source side end of the second drain region 8 and the substrate depth side of the source side end of the first drain region 6. Hereinafter, the corner curves are referred to as "convex parts".

In the P-well 2, a well contact region 10 in which a P-type impurity is doped at high density is formed.

On the surface of the semiconductor substrate 1 including the P-well 2 surface, an interlayer insulating film 11 for electric insulation between the semiconductor substrate 1 and upper wiring (not shown) is formed.

On the source region 5, the first drain region 6, and the well contact region 10, a source electrode 12, a drain electrode 13, and a well electrode 14 are formed to bring ohmic contact between the respective N-type impurity regions (diffusion layer) through connection holes penetrating the interlayer film 11.

[Surge Removal by ESD Operation]

Figure 3:
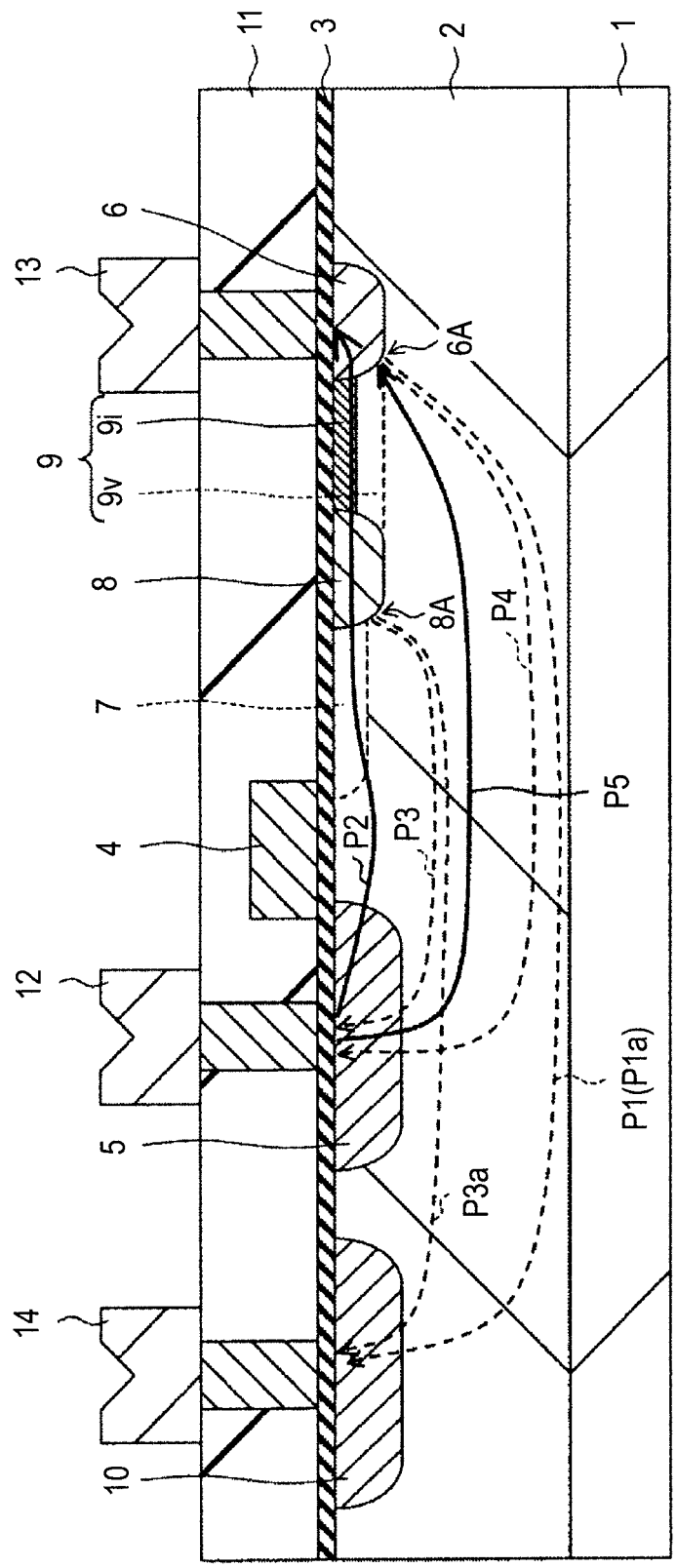
FIG. 3 is an operational explanatory diagram of the MOS transistor-type protection device related to the first embodiment.

The actions of the respective parts when a surge enters the structure in FIG. 2 will be described using FIG. 3. Here, the operation will be explained by taking the case where junction breakdown occurs in the order of the first drain region 6 and the second drain region 8 as an example.

The case where surge current can be regarded as being equivalent to that when a current source monotonously increasing in a ramp functional fashion with time is connected to the drain of the transistor is considered. By the application of the surge regarded as being equivalent to the connection of the current source (substantially application of drain bias), current flows into the drain electrode 13 of the MOS transistor-type protection device TRm in the off state. When the drain current increases, the drain potential gradually rises.

With the rise of the drain potential, first, the electric field relaxation region 7 is depleted by the depleted layer from the P-well 2. Thereby, the electric field on the gate end is relaxed and junction breakdown at the gate end is avoided.

When the drain voltage further increases, the resistive connection region 9 is depleted to some degree. Since the impurity density etc. are determined so that the pinch-off voltage of the resistive connection region 9 may be higher than the drain breakdown voltage, an electrically neutral region 9$i$ remains in the resistive connection region 9. In FIG. 3, the depleted layer at the substrate depth side of the second drain region 8 is denoted by a sign "9$v$".

Note that the depletion of the first drain region 6 and the second drain region 8 is smaller in extent than that in the electric field relaxation region 7 and the resistive connection region 9. Accordingly, the depletion of the first drain region 6 and the second drain region 8 is not mentioned or shown in FIG. 3.

In this operation example, the case where the impurity distribution is determined so that the electric field may be concentrated on the corner curve (the convex part 6A) of the first drain region 6 and first avalanche breakdown (junction breakdown) may occur here will be explained.

Hole current generated by the avalanche breakdown flows in the well along a path P1, and is taken out from the well electrode 14. Simultaneously, the hole current flows in the resistance component in the P-well 2 and the well potential is raised.

The PN junction between the source region 5 and the P-well 2 is biased forward by the raised well potential. Accordingly, electrons are injected from the source region 5 into the P-well 2, the bipolar operation is started, the drain voltage is reduced, and snapback is observed. Since the drain voltage becomes lower, the impact ionization in the convex part 6A due to avalanche breakdown becomes relatively weaker.

On the other hand, the injected electron current flows along a path P2 as the shortest path from the source region 5 to the first drain region 6, passes through the second drain region 8, the resistive connection region 9, and the first drain region 6, and is taken out from the drain electrode 13. Thereby, a potential gradient is produced within the resistive connection region 9. Simultaneously, the electrons passing through the path P2 are accelerated by a high electric field of the convex part 8A and cause impact ionization, and the avalanche breakdown in the convex part 8A becomes relatively stronger. The hole current generated in the convex part 8A mainly flows through a path P3 into the source region 5, and part of the current passes through a path P3$a$ and is taken out from the well electrode 14.

When the surge current further increases, the potential of the first drain region 6 rises again because of the voltage drop generated in the resistive connection region 9 due to the current passing through the path P2. As a result, a critical electric field of avalanche breakdown is reached in the convex part 6A of the first drain region 6 where the electric field is concentrated, and junction breakdown (avalanche breakdown) becomes stronger again in the convex part 6A.

The hole current generated by the junction breakdown that has been stronger again in the convex part 6A flows around the resistive connection region 9 at the high potential downward to the P-well 2 at the low potential, passes through a path P1a, and is mainly taken out from the source electrode 12. As a result, a potential gradient along the path P1a is generated in the deep region of the P-well 2. The electron current injected from the source region 5 is drawn into the potential and electron current along a path P4 is formed.

In the series of process, the first heat generation is concentrated near the convex part 6A where the first junction breakdown occurs and the current and the electric field are concentrated. Then, the electron current in the path P2 increases, and the center of heat generation moves to the convex part 8A.

However, before breakage occurs in the convex part 8A, the avalanche breakdown becomes stronger again in the convex part 6A as a part of first drain region 6 apart from the convex part 8A. As a result, the heat generation region in the high current range is distributed into three regions of the convex part 8A, the convex part 6A, and the electrically neutral region 9i.

Further, the electron current passing through the path P4 and flowing into the first drain region 6 broadly flows on the bottom surface of the first drain region 6 because of the potential gradient spreading from the second drain region 8, and the concentration of current density is relaxed.

As a result, power consumption of ESD surge is distributed in a wide range from the second drain region 8 to the bottom surface of the first drain region 6, the local heat generation is relaxed and ESD breakage of the device is avoided to the higher surge current.

When the impurity density is determined so that the first junction breakdown may occur in the convex part 8A, the hole current generated by the avalanche breakdown flows in the well along a path P3a, and is taken out from the well electrode 14. Simultaneously, the hole current flows in the resistance component in the P-well 2, and the well potential rises.

Then, the operation is performed in the same manner as the above description starting from the sentence "The PN junction between the source region 5 and the P-well 2 is biased forward by the raised well potential".

[Manufacturing Method]

Next, a method of fabricating the MOS transistor-type protection device TRm will be explained with reference to FIGS. 4A to 7 and FIG. 2.

Figure 4A:
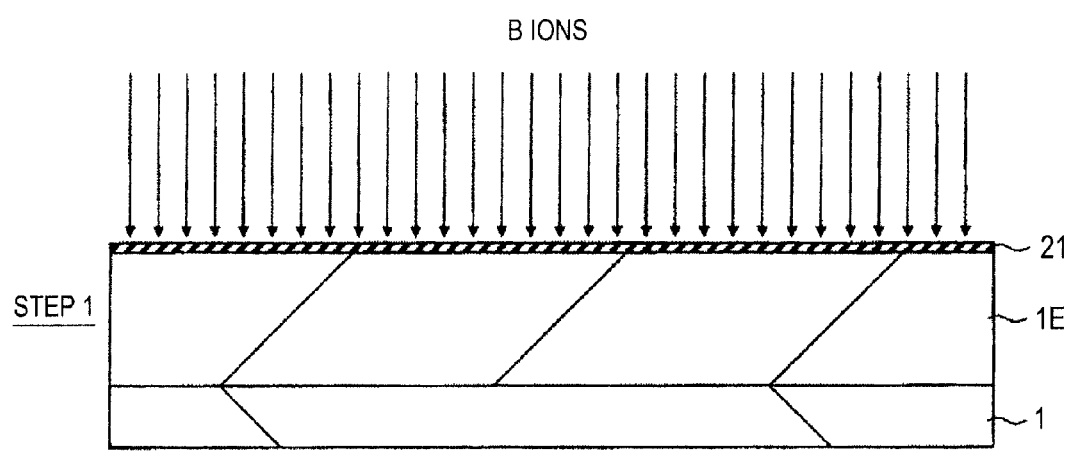
FIGS. 4A and 4B are sectional views in the middle of the manufacturing of the MOS transistor-type protection device related to the first embodiment.

At step 1 in FIG. 4A, in order to form the P-well 2 on the semiconductor substrate 1 of high density P-type silicon, a low-density P-type silicon layer is epitaxially grown. The impurity density of the semiconductor substrate 1 is equal to or more than 1E19 [cm$^{-3}$], for example, and the impurity density of the epitaxial growth layer 1E is equal to or less than 1E15 [cm$^{-3}$], for example.

Subsequently, the surface of the semiconductor substrate 1 is thermally oxidized and a sacrifice oxide film 21 used as a through film for ion implantation is formed.

Then, boron (B) ions are implanted into the semiconductor substrate 1 through the sacrifice oxide film 21, activation annealing is performed thereon, and the P-well 2 of P-type semiconductor is formed. The amount of doze and implantation energy of boron ions are determined so that a desired drain withstand voltage, sheet resistance of the P-well 2, and threshold voltage of the MOSFET formed on the same substrate may be obtained.

Figure 4B:
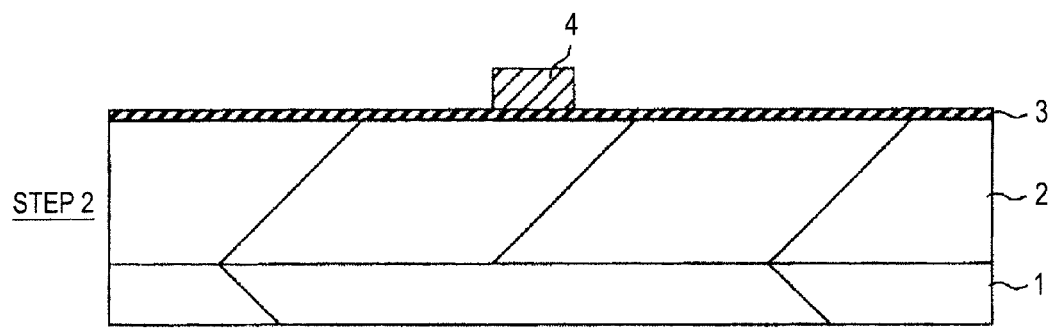

Next, at step 2 in FIG. 4B, the sacrifice oxide film 21 is removed by etching using a fluorine solution, and then, the surface of the semiconductor substrate 1 is thermally oxidized again and the gate insulating film 3 is formed. The thickness of the silicon oxide film as the gate insulating film 3 is determined so that a desired gate withstand voltage and threshold voltage may be obtained in the MOSFET formed on the same substrate.

Subsequently, a polysilicon layer (not shown) is deposited on the gate insulating film 3 using thermal CVD, and phosphorus (P) ions are ion-implanted at high density into the polysilicon layer.

Subsequently, a resist (not shown) is applied to the entire surface of the semiconductor substrate, and then, optical lithography is performed thereon and a gate pattern is transferred to the resist. Then, reactive ion etching is performed using the resist pattern as a mask, and unnecessary parts of the polysilicon layer are removed. Then, the resist is removed by ashing and the gate electrode 4 is obtained.

Figure 5A:
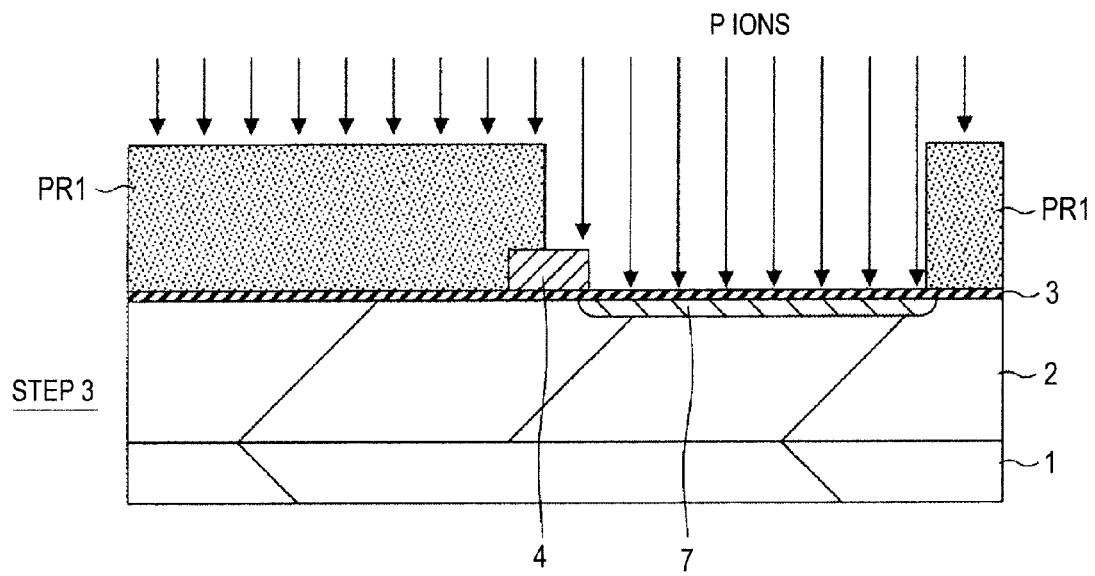
FIGS. 5A and 5B are sectional views of the MOS transistor-type protection device at the steps subsequent to FIG. 4B.

Then, at step 3 in FIG. 5A, the semiconductor substrate 1 is covered by a resist PR1, optical lithography is performed thereon, and the part from the gate electrode 4 to the region to be the first drain region 6 (see FIG. 2) is opened. Subsequently, phosphorus (P) ions for formation of the electric field relaxation region 7 are implanted into the surface of the semiconductor substrate 1. The amount of doze and implantation energy of phosphorus (P) may be determined according to the thickness of the gate insulating film 3 as the through film and the desired drain withstand voltage. Then, the resist PR1 is removed by ashing or the like.

Figure 5B:
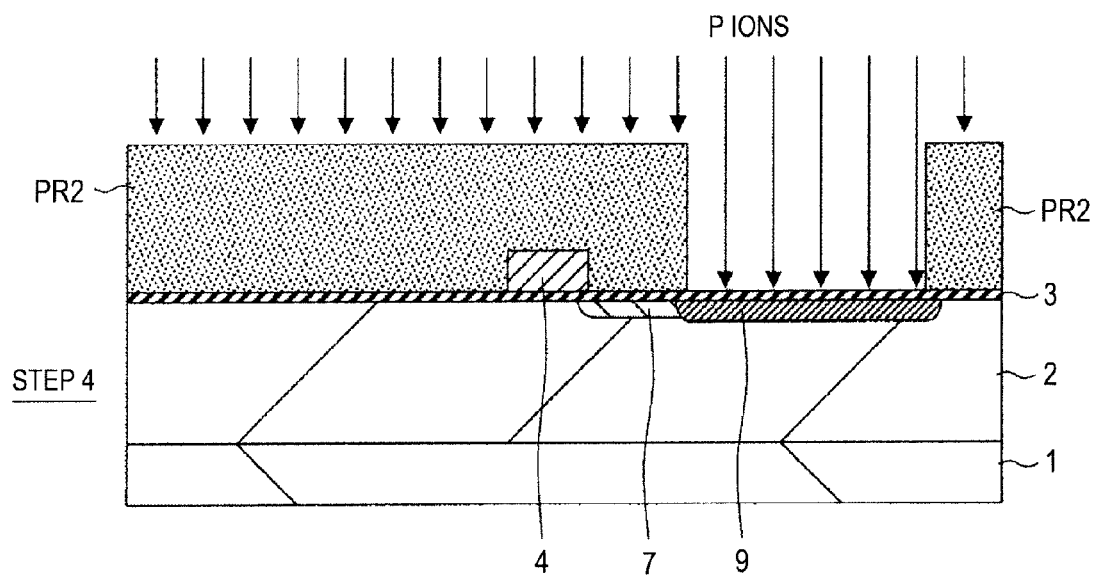

Then, at step 4 in FIG. 5B, the semiconductor substrate 1 is covered by a resist PR2, optical lithography is performed thereon, and the part from the second drain region 8 to the region to be the first drain region 6 (see FIG. 2) is opened. Subsequently, phosphorus (P) ions for formation of the resistive connection region 9 are implanted into the surface of the semiconductor substrate 1. The amount of doze and implantation energy of phosphorus (P) are determined so that the pinch-off voltage of the resistive connection region 9 may be higher than the drain withstand voltage. Then, the resist PR2 is removed by ashing or the like.

Figure 6A:
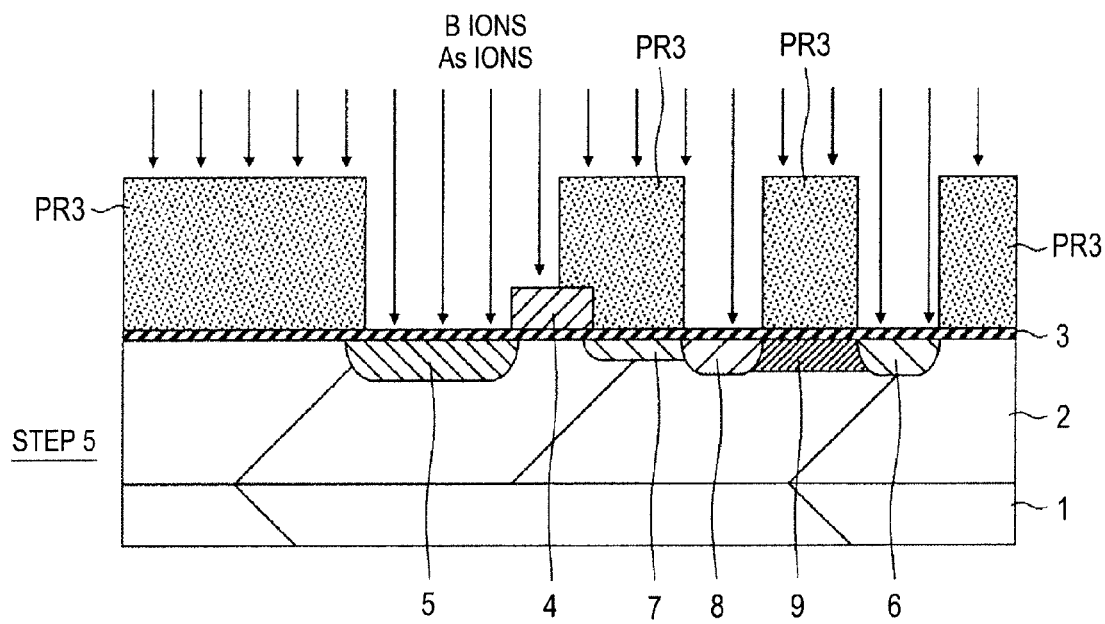
FIGS. 6A and 6B are sectional views of the MOS transistor-type protection device at the steps subsequent to FIG. 5B.

Then, at step 5 in FIG. 6A, the semiconductor substrate 1 is covered by a resist PR3, optical lithography is performed thereon, and the regions of the source region 5, the first drain region 6, and the second drain region 8 are opened. Subsequently, arsenic (As) ions and phosphorus (P) ions are sequentially implanted into the surface of the semiconductor substrate 1. The amounts of doze and implantation energy of the respective ions are determined so that the surface density sufficient to form ohmic contact between the source electrode and the drain electrode, which will be formed later, and the junction depth deeper than in the resistive connection region 9 may be obtained. Then, the resist PR3 is removed.

Figure 6B:
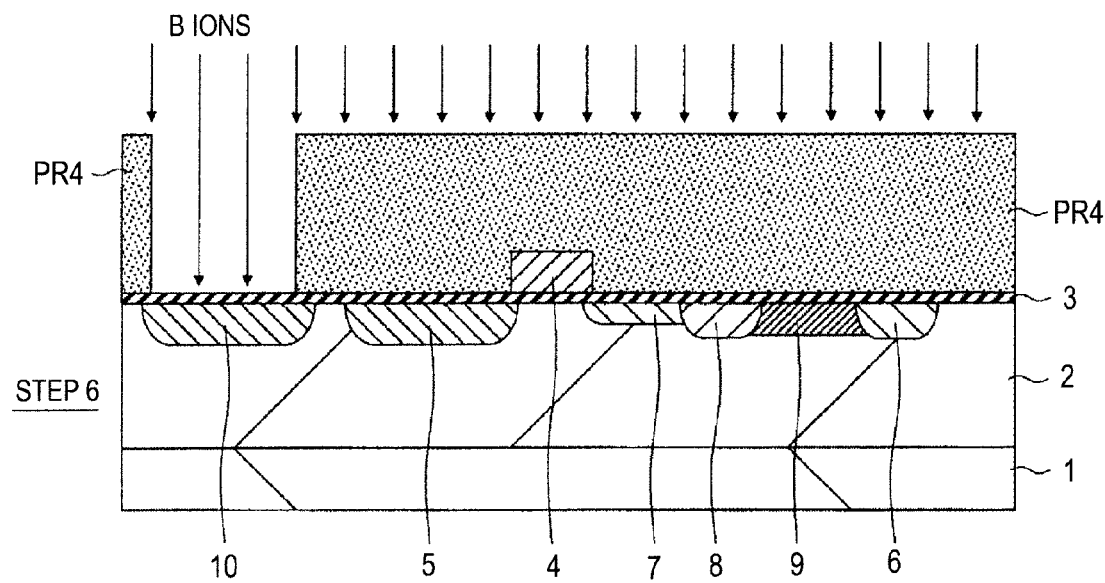

Next, at step 6 in FIG. 6B, the semiconductor substrate 1 is covered by a resist PR4, optical lithography is performed thereon, and the region for forming the well contact region 10 is opened. Subsequently, boron (B) ions or boron fluoride (BF$_2$) ions are implanted into the surface of the semiconductor substrate 1. The amounts of doze and implantation energy are determined so that the surface density sufficient to form ohmic contact between the well electrode, which will be formed later, and itself may be obtained. Then, the resist PR4 is removed.

Figure 7:
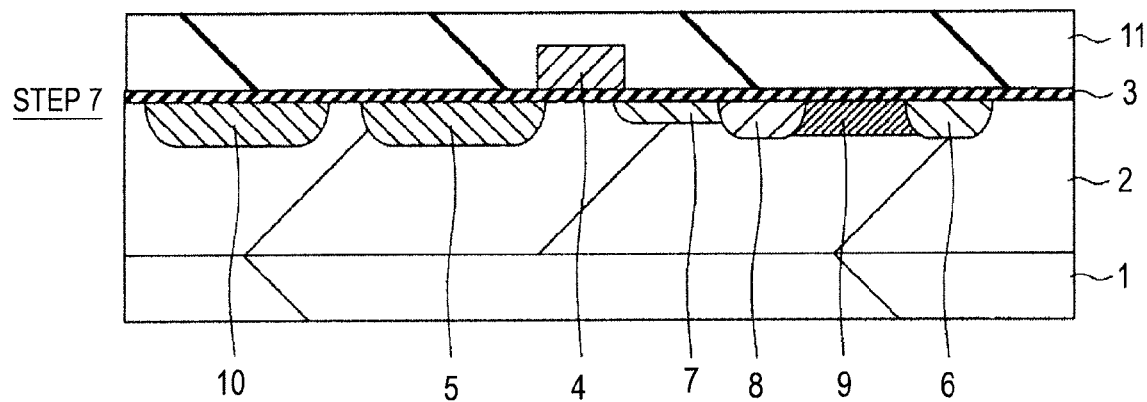
FIG. 7 is a sectional view of the MOS transistor-type protection device at the step subsequent to FIG. 6B.

Then, at step 7 in FIG. 7, heat treatment is performed on the substrate and the impurity atoms with the ions implanted at the above described steps are activated.

Subsequently, $SiO_2$ is thickly deposited on the substrate surface by plasma CVD, the surface is planarized using CMP, and thereby, the interlayer insulating film 11 is obtained.

Subsequently, a resist film (not shown) is formed on the entire surface of the substrate, optical lithography is performed thereon, and a pattern of connection holes to be provided on the source region 5, the first drain region 6, and the well contact region 10 is transferred to the resist film. Then, reactive ion etching is performed and the connection holes to the respective parts are formed.

Next, at step 8, a metal such as tungsten is embedded in the connection holes by sputtering and CVD, and a wiring layer of aluminum is formed further thereon. Thereby, as shown in FIG. 2, the source electrode 12, the drain electrode 13, and the well electrode 14 are obtained.

In the above described manner, the MOS transistor-type protection device TRm related to the first embodiment is obtained.

Here, the manufacturing method of the MOS transistor-type protection device TRm that can be used as an N-channel GGMOS is explained.

However, a P-channel protection device may be fabricated in the same procedure by providing the conductivity types of impurities doped at the respective steps opposite to those in the above explanation.

Further, the start substrate is not necessarily a high-density P-type substrate, but may be a high-resistance P-type substrate or N-type substrate.

Note that, in the first embodiment and the other embodiments, the semiconductor substrate 1 is not limited to a substrate made of a semiconductor material of silicon or the like. For example, the case where a substrate made of a material of semiconductor or other than semiconductor is used as a support substrate and a semiconductor layer is formed on the substrate is defined to belong to a category of "semiconductor substrate" in the embodiments of the invention. Accordingly, a substrate for forming a thin-film transistor, an SOI substrate having an SOI layer insulatively separated from the substrate or the like may be used as the semiconductor substrate.

Next, in the first embodiment, advantages of separating the second drain region 8 from the gate electrode 4 at a predetermined distance and advantages related to "resistive connection region 9" will be explained.

For example, as in JP-A-2002-9281, in the case where the N-type impurity region functioning as a resistance layer when the region itself causes junction breakdown overlaps with the gate electrode 4 on the pattern, there are many restrictions on the drain withstand voltage and it is difficult to realize the higher voltage resistance. That is, in the structure of JP-A-2002-9281, the drain withstand voltage is restricted by all of the punch-through voltage between the source and the drain, the junction withstand voltage between the drain and the well, and the insulating film withstand voltage between the gate and the drain. Accordingly, it is very difficult to set the drain withstand voltage having an appropriate amplitude for the withstand voltage of the internal circuit (FIGS. 1A and 1B) by the MOS transistor-type protection device.

On the other hand, according to the first embodiment, the second drain region 8 is apart from the well region part immediately below the gate electrode 4, and the degree of freedom of setting of the withstand voltage between the drain and itself is high. Therefore, even in the case where the internal circuit has a high withstand voltage, an ESD protection withstand voltage can be set above that.

Further, since there is no silicide layer, there are less variation factors such that the impurity density becomes lower due to heating at silicide formation. Especially, the resistive connection region 9 has an optimum range of the predetermined resistance value after the first drain region 6 or the second drain region 8 first breaks down for the impurity concentration profiles of the first drain region 6, the second drain region 8, and the P-well 2. Accordingly, it is necessary to avoid great change in impurity concentration profiles as much as possible, after formation of the resistive connection region 9, by sucking out the impurity in the process of silicidation heating or the like, or heating itself in the resistive connection region 9 and other adjacent drain regions.

In JP-A-2002-9281, the drain region is formed by two low-density impurity regions and a high-density impurity region between them as a whole. However, the high-density impurity region is silicided, and the resistance value varies to some degree in the part. Further, the part on the high-density impurity region including the drain region is silicided, and the silicide is near the breakdown points. Since the heat generation locations are near the silicide layer, it may be highly possible that defects of breakage of the part and change in the resistance value of the silicide, or the like occur.

In the MOS transistor-type protection device TRm of the first embodiment, the silicide layer causing the defects is not formed.

Next, advantages over a typical DE-MOSFET will be described. First, the DE-MOSFET will be explained in detail and the advantages provided by the difference between the transistor structure related to the embodiment and itself will be made clear by a simulation.

Comparative Example 1

DE-MOSFET

Figure 8:
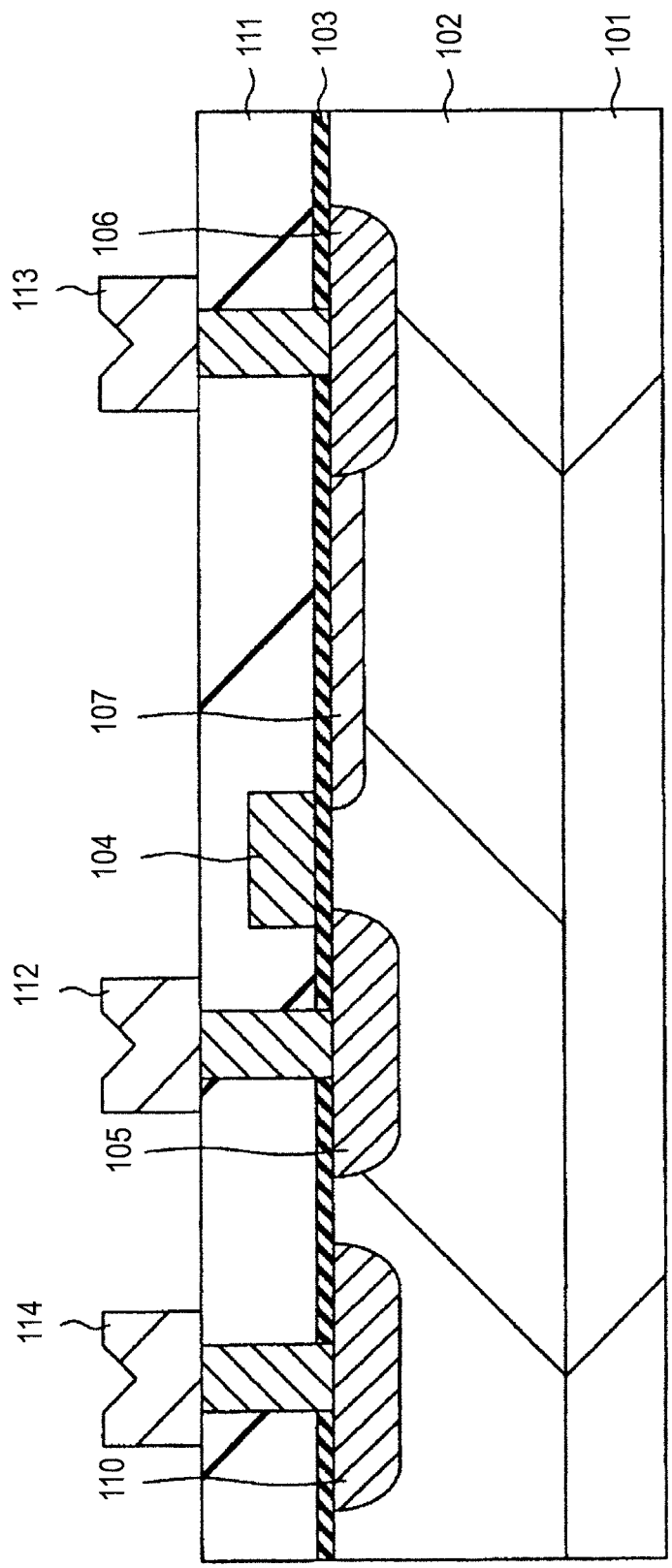
FIG. 8 is a sectional view of a MOS transistor-type protection device as a comparative example.

FIG. 8 is a sectional structure diagram of a drain-extended MOS transistor (DE-MOSFET) including an electric field relaxation region for improving the drain withstand voltage.

In the structure shown in FIG. 8, a P-well 102 is formed on a semiconductor substrate 101. On the surface of the semiconductor substrate 101 (strictly, the P-well 102), a gate insulating film 103 is formed by thermal oxidation or the like. The P-well 102 has an impurity distribution determined for obtainment of a predetermined threshold voltage and a sheet resistance of the well like the P-well 2 in FIG. 2.

Agate electrode 104 is formed on the gate insulting film 103. One side in the width direction of a finger part forming the gate electrode 104 is the source side and the other side is the drain side.

A source region 105 is formed within the P-well 102 to partially overlap with the one end of the gate electrode 104. Further, a drain region 106 is formed within the P-well 102 apart from the other end of the gate electrode 104. An N-type impurity is doped at high density in the source region 105 and the drain region 106.

An N-type electric field relaxation region 107 at the lower density than the drain region 106 is formed between the drain region 106 and the well region part immediately below the gate electrode 104. One end of the electric field relaxation region 107 overlaps with the end of the gate electrode 104. In the electric field relaxation region 107, generally, the entire length in the depth direction is depleted at operation like a so-called LDD region, extension, or the like. Accordingly, at application of a drain bias (e.g., drain voltage) when junction breakdown occurs, no electrically neutral region remains in the electric field relaxation region 107.

In the P-well 102, a high-density P-type well contact region 110 is formed. A well electrode 114, a source electrode 112, and a drain electrode 113 connected to the well contact region 110, the source region 105, and the drain region 106 via plugs or the like are formed as wiring on the interlayer insulating film 111, respectively.

Here, the electric field relaxation region 107 is provided to increase the drain withstand voltage. The electric field relaxation region 107 bears a large part of the electric field between the drain and the gate, and the electric field generated at the gate end is relaxed and the drain voltage causing the breakage at the gate end is raised.

For the electric field relaxation region 107 to bear the sufficient voltage, the density of the electric field relaxation region 107 is designed to be sufficiently low and the length is designed to be sufficiently long.

As a result, the drain withstand voltage is substantially determined by the junction withstand voltage between the drain region 106 and the P-well 102.

[TLP Measurements]

A GGMOS is formed by the DE-MOSFET having the structure shown in FIG. 8, and TLP (Transmission Line Pulsing) measurement is performed thereon.

Figure 9:
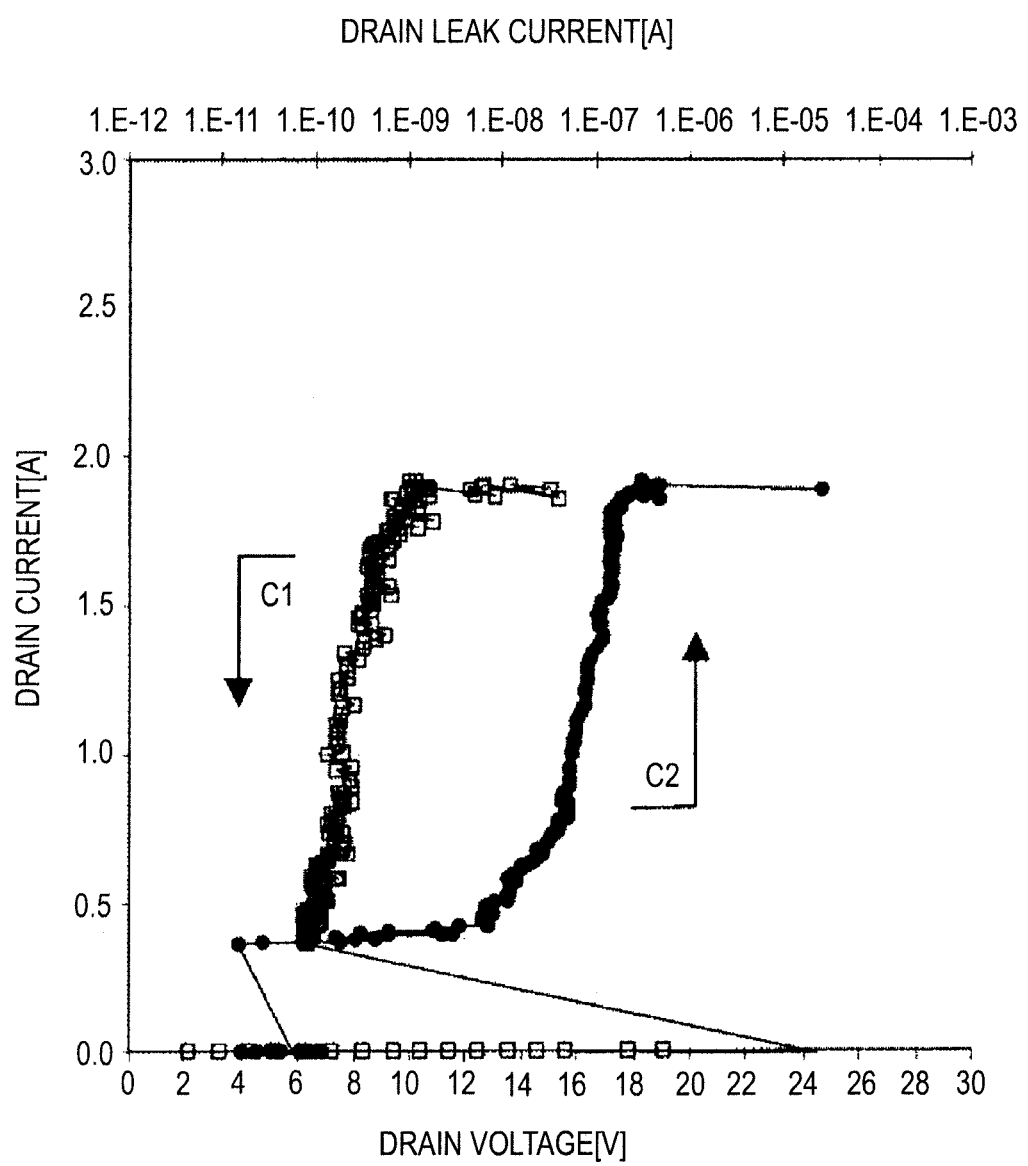
FIG. 9 is a graph of drain voltage-current characteristics showing snapback in the MOS transistor-type protection device of the comparative example.

FIG. 9 shows a result of TLP measurement of the DE-MOSFET of the comparative example.

A curve C1 shown in FIG. 9 is obtained by providing voltage pulse to the drain electrode 113 in FIG. 8 and measuring a relationship between the transitional drain voltage value and drain current value at time after a predetermined time (e.g., 100 [ns]) has elapsed while sequentially increasing the voltage amplitude of the input pulse.

In the curve C1, as the drain voltage is raised, about 0.4 [A] of drain current rapidly starts to flow near 24 [V] due to the above described first junction breakdown, and the drain voltage instantaneously becomes lower to about ¼ of the peak value. The phenomenon that the drain voltage reverts is called "snapback (phenomenon)". After snapback, the drain voltage and the drain current gradually increase as reflections of increases of pulse height values with respect to each subsequent pulse application.

A curve C2 shown in FIG. 9 shows a results of drain leak current measurement performed alternately with the drain current measurement at obtainment of the curve C1. More specifically, the respective points of the curve C2 are current values plotted with the drain current of the point on the curve C1 measured immediately before as the vertical axis and the drain leak current measured immediately after the measurement of the point on the curve C1 as the horizontal axis.

As shown by the curve C2, the measured drain leak current of the protection device (DE-MOSFET) sequentially increases with the increase in the number of measurements after the first snapback. This suggests that the drain junction breakage progresses at each time of snapback.

An assumed cause of the above described occurrence of leak will be explained using FIG. 10.

Figure 10:
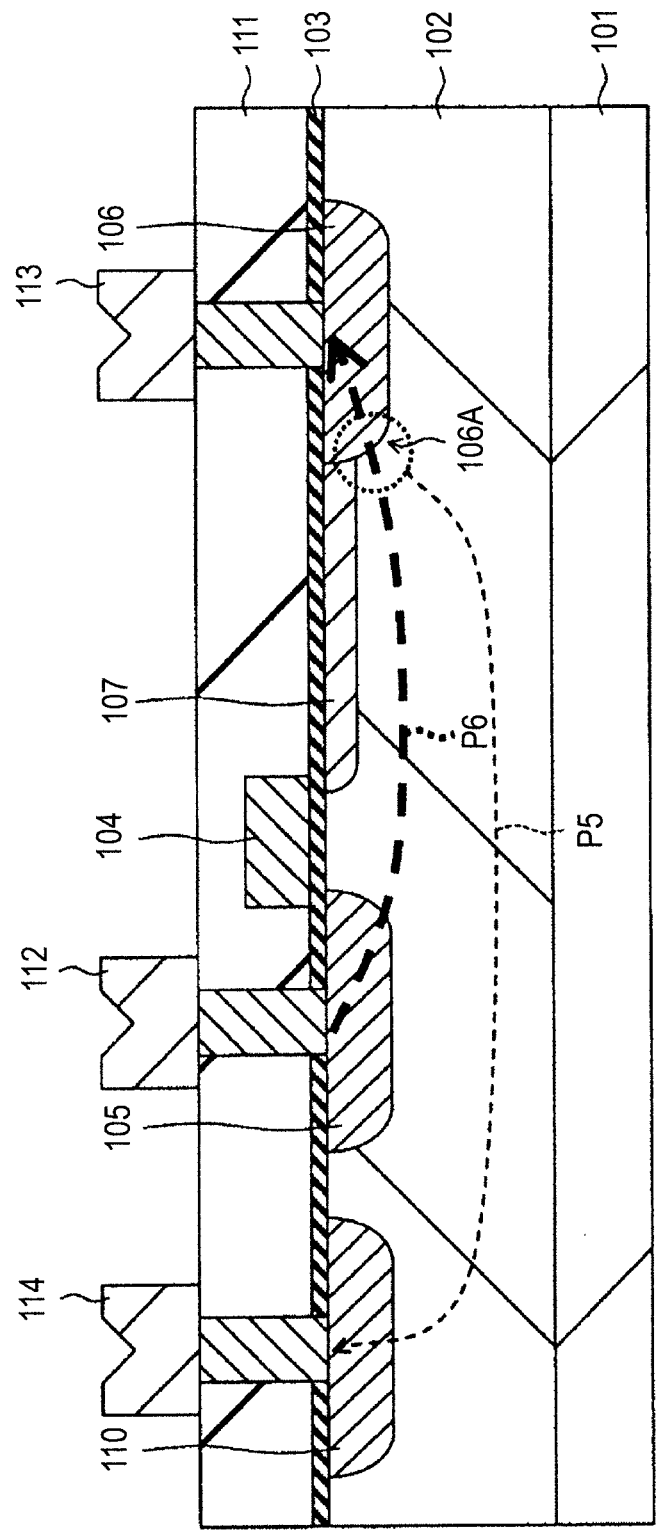
FIG. 10 is an operational explanatory diagram of the MOS transistor-type protection device of the comparative example.

FIG. 10 shows a situation immediately after snapback is induced in the DE-MOSFET in FIG. 8.

First, under the condition that the source electrode 112, the well electrode 114, and the gate electrode 104 are grounded, the current allowed to flow into the drain electrode 113 is increased. Then, the drain voltage rises, depletion of the electric field relaxation region 107 progresses, the entire region is depleted before the drain voltage reaches the drain breakdown voltage. Thereby, the electric field concentrated on the gate end is relaxed, the occurrence of breakage at the gate end is avoided, and thus, the role of the electric field relaxation region is fulfilled.

When the larger drain current is allowed to flow by increasing the drain application voltage, the electric field becomes the maximum in a convex part 106A as a junction part having a curvature at the substrate depth side of the drain region 106. Then, when the drain voltage reaches the drain breakdown voltage, avalanche breakdown starts at some limited points in the convex part 106A on the section of the wafer and the drain region 106 on the wafer flat surface. The points where avalanche breakdown starts typically have spot forms, and called "hot spots".

Of a pair of a hole and an electron generated by the avalanche breakdown, the electron flows into the drain region 106 and the hole passes through a path P5 and flows from the well contact region 110 into the well electrode 111. Simultaneously, the hole current raises the potential of the P-well 102 because of the resistance of the P-well 102, and the PN junction between the source region 105 and the P-well 102 is biased forward.

When the even larger drain current is allowed to flow by further increasing the drain application voltage, the drain voltage rises and the hole current due to impact ionization increases. Accordingly, the substrate potential reaches the turn-on voltage of the PN junction before long, and electrons are injected from the source region 105 into the P-well 102.

The electron current flows from the convex part 106A to the drain region 106 via a path P6 because of the potential gradient formed by diffusion and hole current. When the PN junction between the source and the substrate is turned on, the impedance between the drain and the source becomes lower, the drain voltage is reduced, and snapback is observed. Since the drain voltage becomes lower, no avalanche breakdown may occur at points other than the hot spots, and the breakdown current concentrically flows to the hot spots on the wafer flat surface.

In this way, the electric field and the electron current density are concentrated on the vicinity of the convex part 106A of the drain region immediately after snapback, and thus, the electric energy of the surge is concentrically consumed near the region and generates heat.

It is considered that, because of the concentration of heat generation, crystal defects in the semiconductor substrate 1 multiply and the leak current shown in FIG. 9 increases. Such leak current is prominently generated in the MOSFET at the high drain withstand voltage, and especially problematic in middle to high withstand voltage semiconductor integrated circuits.

Figure 11A:
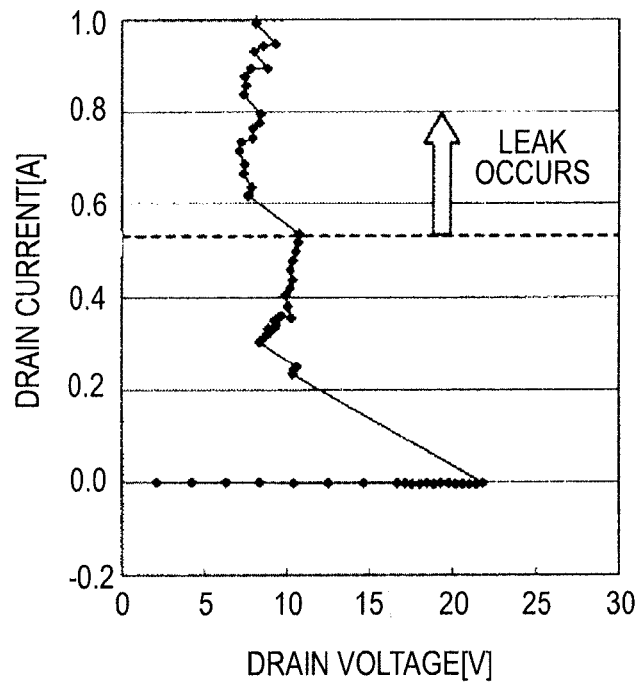
FIGS. 11A and 11B are graphs showing a relationship between the drain current and the drain voltage and a relationship between the drain current and the drain leak current.
Figure 11B:
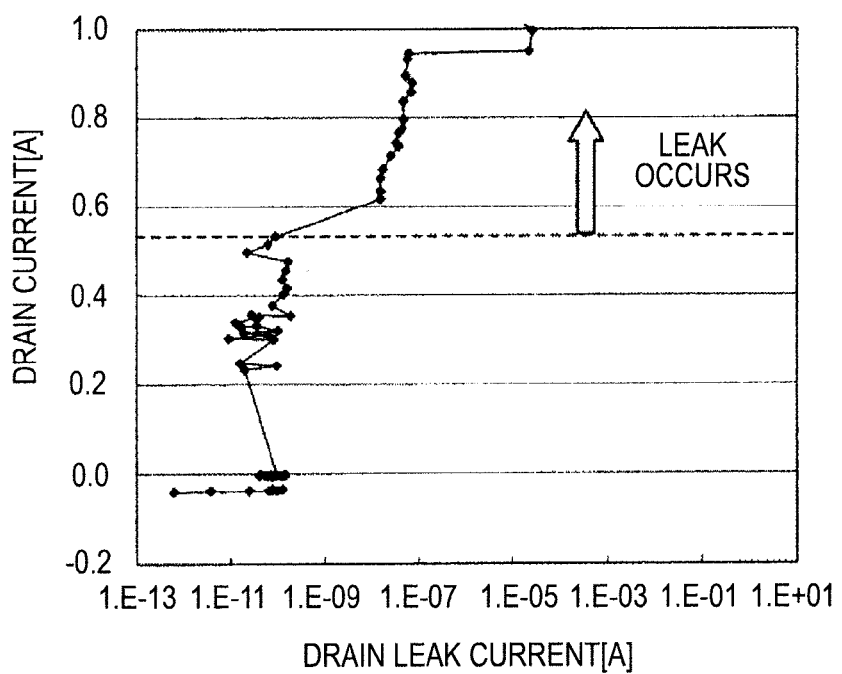

FIGS. 11A and 11B show examples of results of TLP measurement of the protection device of the embodiment (see FIG. 2). FIGS. 11A and 11B separately show relationships of the drain voltage and the drain leak current with the drain current.

As shown in the drawing, although the protection device has nearly the same gate width as that of the protection device of the comparative example shown in FIG. 9, the drain current causing the junction leak increases from 0.4 [A] in the case of the comparative example to 0.55 [A] or more.

On the basis of the above described results, the operation in the embodiment will be described as follows in comparison to the comparison examples.

(1) A surge is input to the drain of the protection device. The behavior of the protection device may be regarded as being equivalent to the case where a current source in which current monotonously increases with time is connected to the drain of the protection device according to a certain model.

(2) The drain potential rises due to the current caused by the surge input to the drain, and, at a certain voltage, avalanche breakdown starts to occur from some weak point in the drain width, i.e., a hot spot.

(3) The holes generated in the breakdown point flow as hole current to the substrate contact through the substrate, and raise the substrate potential.

(4) When an amount of the hole current becomes a certain degree, the substrate potential reaches the turn-on voltage of PN junction, and electrons are injected from the source region into the substrate. The electron current exponentially increases with respect to the substrate bias and the impedance between the source and the drain rapidly becomes lower.

(5) As a result of the reduced impedance, the potential near the breakdown point becomes lower.

(5-1) Case of Comparison Example

Concurrently, in the comparative example, the breakdown point is close to the silicide at nearly the same potential, and the potential of the breakdown point becomes lower and the potential of the entire silicide region is reduced to the drain breakdown voltage or less over the entire drain width. As a result, any junction breakdown does not occur in the regions other than at the point where breakdown has already occurred, and the breakdown current concentrically flows into the one point (the hot spot) where breakdown has first occurred. Accordingly, here, the local current density becomes extremely high.

Further, in the comparative example, heat generation (power consumption density) is concentrated on the short part of the drain region. As a result, the silicon of the substrate is thermally damaged in the heat generation concentration location, and crystal defects to be a cause of soft leak are produced.

(5-2) Case of the Embodiment

On the other hand, in the structure of the embodiment, also the potential of the breakdown point once drops, and the breakdown current concentrically flows there.

However, in the structure of the embodiment, the heat generation location at the high breakdown current density is distributed in a broad region from the second drain region 8 to the bottom surface of the first drain region 6. Accordingly, if the current causing breakage in the comparison example is input, the location is less subject to the damage due to heat generation concentration.

The resistive connection region 9 exists between the breakdown point (the leading end of the second drain region 8) and the first drain region 6. The resistive connection region 9 functions as a ballast resistance. Accordingly, as the breakdown current increases, the voltage drop in the resistive connection region 9 increases, and the potential of the first drain region 6 turns to increase.

As a result, the drain voltage is recovered to a voltage equal to or more than the drain breakdown voltage again, and junction breakdown starts at other points and finally junction breakdown occurs over the entire gate width.

Thereby, the current density around the gate width becomes lower and concentration on one point of surge current is avoided.

(6) Consequently, in the embodiment, crystal defects causing soft leak are not produced and high It2 (secondary breakdown current, break current) is obtained.

The above description will be summarized as follows. In the embodiment, first, even when junction breakdown starts at one point, heat generation concentration is distributed and thermal damage in the one point is avoided. During withstanding, the surge current increases and the drain voltage is raised again. Then, the drain breakdown voltage is reached at the other points and junction breakdown starts.

When the surge current further increases, junction breakdown finally occurs over the entire drain width.

In such a process, production of local crystal defects at the end of the drain causing soft leak can be avoided, and breakage of the entire device can be avoided to the higher current (It2) even when the surge current further increases because the concentration of heat generation is distributed.

2. Second Embodiment

Figure 12:
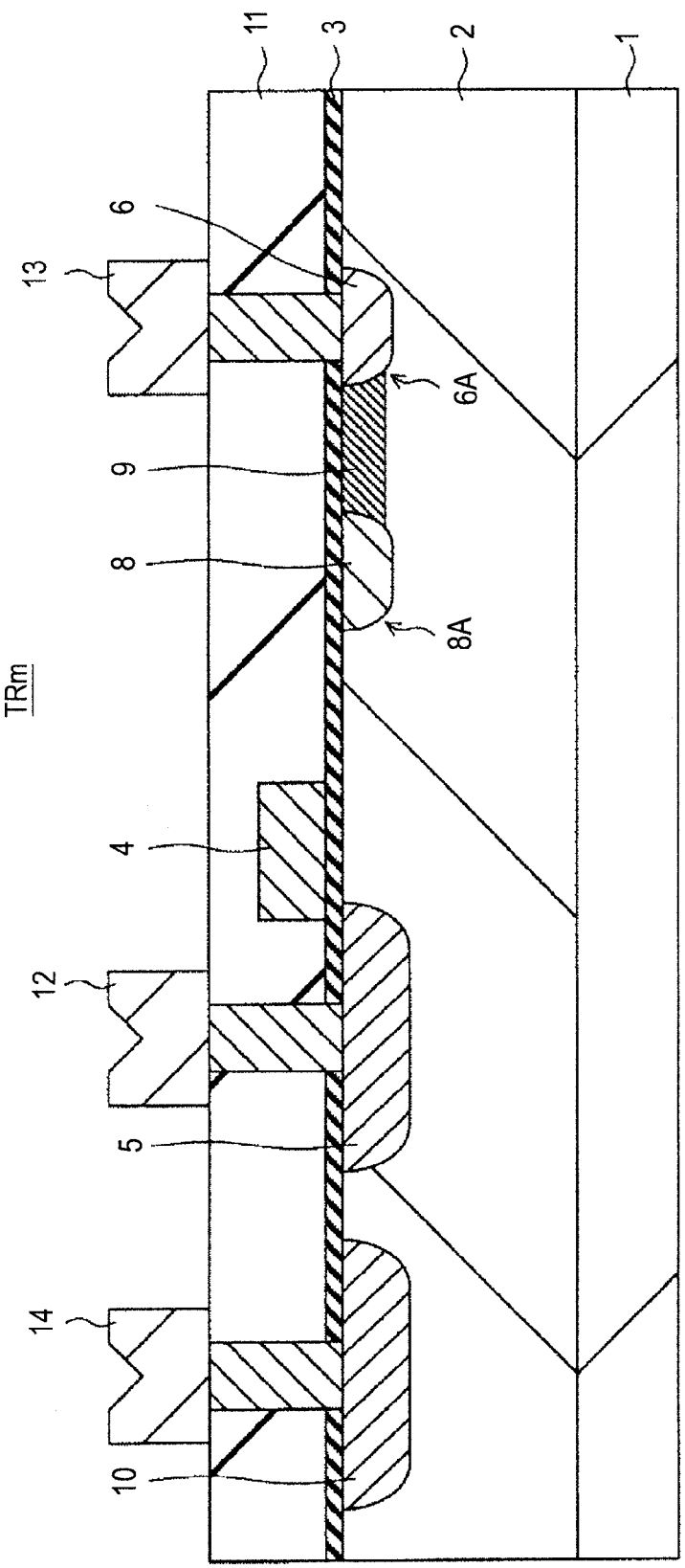
FIG. 12 is a sectional structure diagram of a MOS transistor-type protection device related to the second embodiment.

FIG. 12 is a sectional view of a MOS transistor-type protection device TRm related to the second embodiment.

The structure shown in FIG. 12 is a structure formed by removing the electric field relaxation region 7 from the structure in FIG. 2.

In the MOS transistor-type protection device shown in FIG. 12, the resistive connection region 9 functions as a ballast resistance when first junction breakdown occurs in the convex part 8A or the convex part 6A as is the case of the first embodiment. Accordingly, an effect that the drain voltage rises oppositely due to the voltage drop of the resistive connection region 9 is obtained. As a result, the production of local crystal defects at the end of the drain causing soft leak can be avoided, and breakage of the entire device can be avoided to the higher current (It2) even when the surge current further increases because the concentration of heat generation is distributed.

Further, since the first drain region 6 and the second drain region 8 are apart from the well region part below the gate electrode 4 at the predetermined distance, the withstand voltage of the protection device can be set without restriction of the withstand voltage between the drain and the gate.

3. Third Embodiment

As is clear from the above described operation of the first embodiment, the MOS transistor-type protection device TRm intrinsically performs bipolar transistor operation, and thus, the gate electrode 4 is unnecessary.

Figure 13:
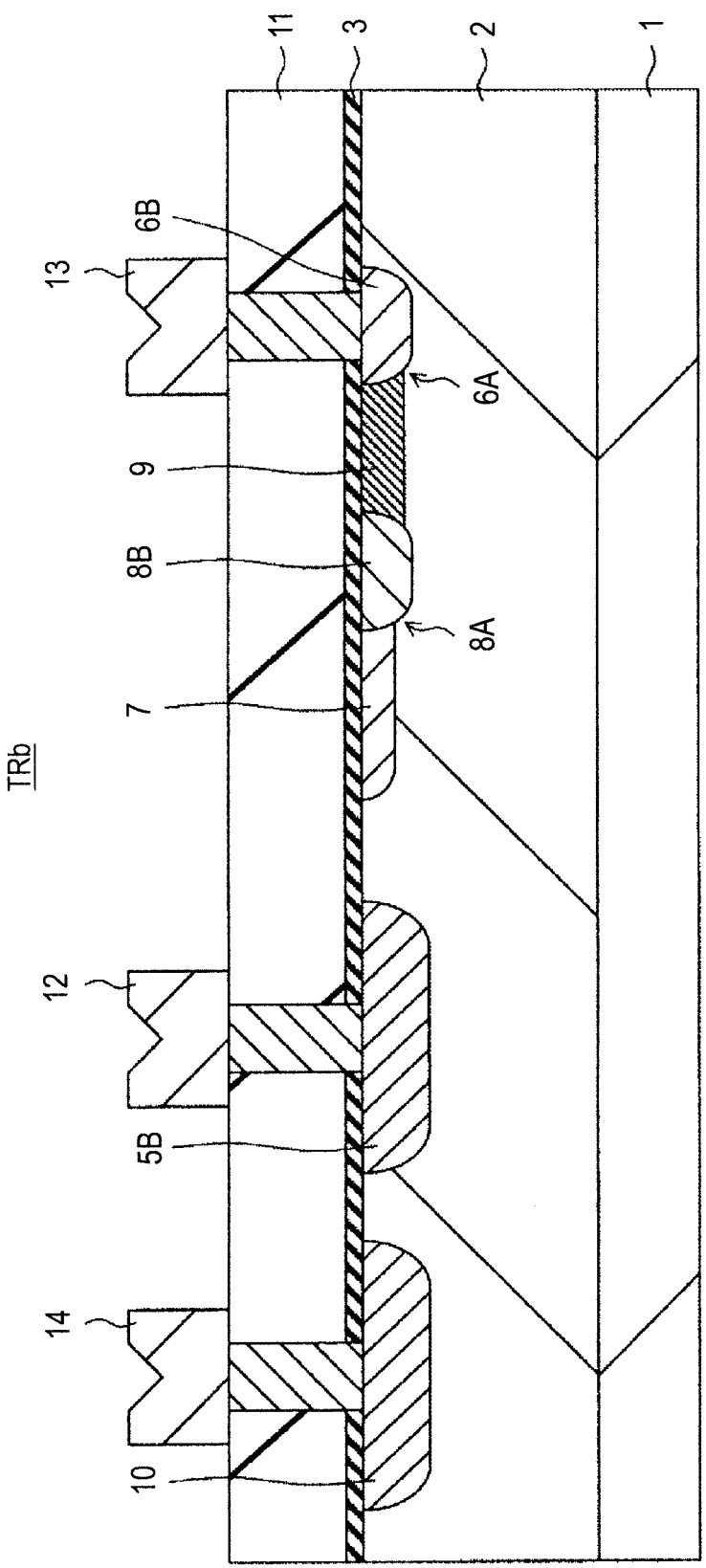
FIG. 13 is a sectional structure diagram of a MOS transistor-type protection device related to the third embodiment.

FIG. 13 is a sectional view of a bipolar transistor-type protection device related to the third embodiment.

The structure shown in FIG. 13 is a structure formed by removing the gate electrode 4 and the gate insulating film 3 from the structure in FIG. 2.

The bipolar transistor-type protection device TRb shown in FIG. 13 may be used in place of the MOS transistor-type protection device TRm in FIGS. 1A and 1B.

In FIG. 13, a term "emitter region 5B" is used in place of the source region 5. A term "first collector region 6B" is used in place of the first drain region 6. A term "second collector region 8B" is used in place of the second drain region 8. Further, the P-well 2 functions as "base region", and the well contact region 10 functions as "base contact region".

The manufacturing method, materials, and other structure parameters may be the same as those in the first embodiment.

According to the bipolar transistor-type protection device TRb shown in FIG. 13, the same effect as that in the first embodiment that has been summarized in the second embodiment can be obtained. Without the gate electrode, the restrictions are further relaxed and the withstand voltage as the protection device can be freely determined.

4. Fourth Embodiment

Figure 14:
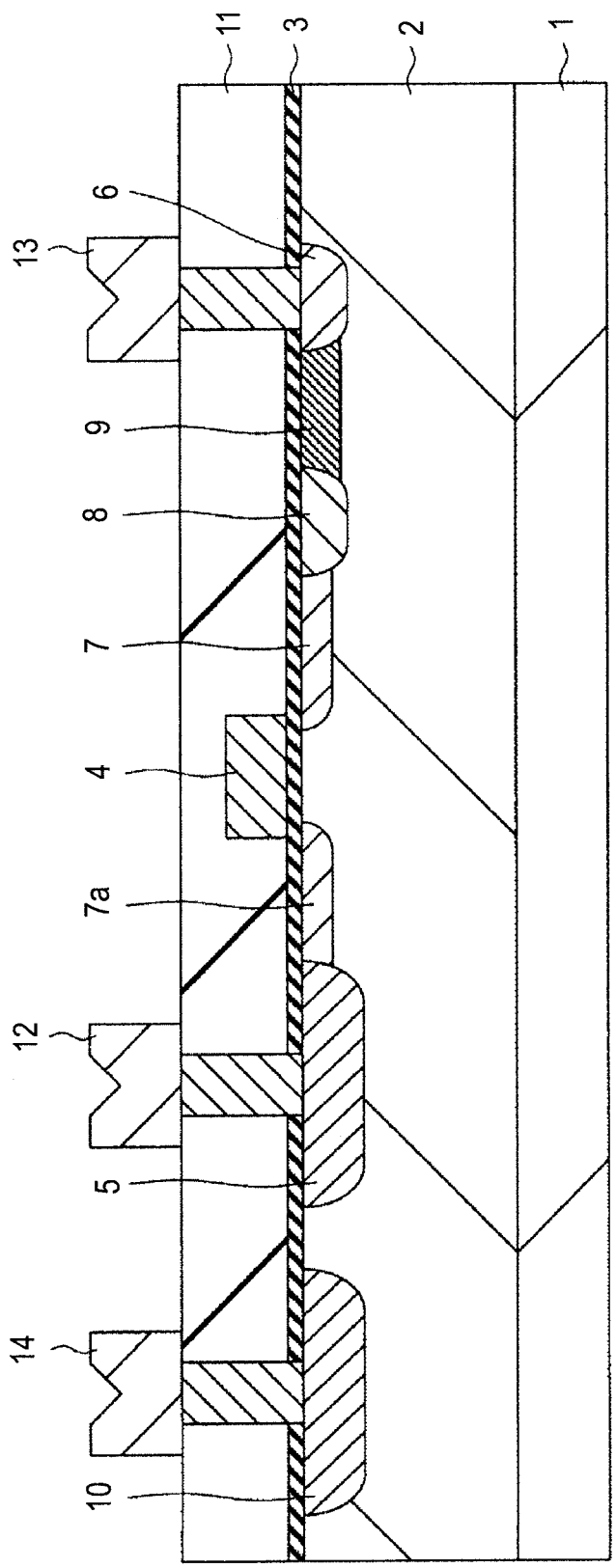
FIG. 14 is a sectional structure diagram of a MOS transistor-type protection device related to the fourth embodiment.

FIG. 14 is a sectional view of a MOS transistor-type protection device TRm related to the fourth embodiment.

The structure shown in FIG. 14 is a structure formed by adding a low-density region 7a formed at the same steps as those of the electric field relaxation region 7 between the source region 5 and the gate electrode 4 of the structure in FIG. 2.

By the length of the added low-density region 7a in the channel length direction, the on-resistance of the snapback curve can be adjusted to a desired value. In addition, the same effect as that of the first embodiment summarized in the second embodiment can be obtained in the fourth embodiment.

5. Fifth Embodiment

FIGS. 15A, 15B1, and 15B2 are sectional structure diagrams of a MOS transistor-type protection device related to the fifth embodiment.

In the fifth embodiment, as shown in FIG. 15A, two plugs 11A respectively connecting to the first drain region 6 and the second drain region 8 are formed within the interlayer insulating film 11. A thin-film resistance layer 9F in contact with the two plugs 11A is formed on the interlayer insulating film 11. In FIG. 15A, the drain electrode 13 is formed on the thin-film resistance layer 9F. The thin-film resistance layer 9F can be formed from a material of doped polysilicon, $WSi_2$ or the like, for example.

The thin-film resistance layer 9F is an example of a member that is included in "resistive connection part" and connects the first drain region 6 and the second drain region 8 with a predetermined electric resistance.

Note that, when the thin-film resistance layer 9F is easily damaged at processing of the drain electrode 13, for example, as shown in FIG. 15B2, an insulator film 15 may be formed on the thin-film resistance layer 9F. An opening part that opens the thin-film resistance layer 9F is formed in the insulator film 15, and the drain electrode 13 and the thin-film resistance layer 9F are connected via the opening part.

Alternatively, when there is no concern of cut due to level difference, as shown in FIG. 15B1, the thin-film resistance layer 9F may be formed to cover the drain electrode 13. In this case, the plugs 11A are not necessarily formed.

The function of the thin-film resistance layer 9F as a ballast resistance for allowing current to flow, after first junction breakdown occurs, so that junction breakdown can occur in the next location is the same as that in the other first to fourth embodiments.

The above described first to fifth embodiments can be freely combined for implementation as long as they have an exclusive relationship, that is, except the case where it is clear that application of one embodiment and the other embodiment may be impossible at the same time.

For example, the use of the thin-film resistance layer 9F disclosed in the fifth embodiment can be combined not only with the first embodiment but also with the second to fourth embodiments.

Further, in the first to fifth embodiments and the embodiments in combination thereof, various modifications described as below can be made. The following modified examples may be arbitrarily combined.

Modified Example 1

The structural feature of the transistor-type protection device related to the first to fifth embodiments is having plural drain regions and a resistive connection part connecting between the plural drain regions with a predetermined electric resistance. In the first to fifth embodiments, the case where the resistive connection part (semiconductor region or thin-film resistance) connects between the two drain regions is shown as an example. The number of drain regions may be three or more, and, in this case, the adjacent two drain regions may be connected by one resistive connection part. Alternatively, an arbitrary number equal to or more than three of drain regions may be connected by one resistive connection part. Therefore, all drain regions may be connected by one resistive connection part.

It is desirable that the drain bias is applied to the farthest side from the source (emitter). Depending on the two-dimensional arrangement in the plane pattern, the distances of the plural drain regions from the source may be equally provided. In this case, to which drain region of the plural drain regions the drain bias is applied is optional.

Modified Example 2

It is not necessary that the impurity density in the resistive connection region 9 related to the first to fourth embodiments is uniform over the entire length, but the density and the junction depth may be partially modified.

Further, a silicide may be formed from a material of $CoSi_2$ at the interface between the drain electrode 13 and the first drain region 6 for reducing the contact resistance. Note that, in this case, it is desirable that the silicide layer is formed at 0.1 [μm] or more inside from the perimeter of the drain region.

Modified Example 3

In the first to fifth embodiments, the semiconductor substrate 1 may be a P-type high-density semiconductor substrate. In this case, the P-well 2 may be formed by an epitaxial growth layer at low density. An impurity may be added to the P-well 2 so that a desired sheet resistance and a threshold voltage of MOSFET may be obtained. With the structure, the improvement in ESD resistance can be obtained.

Further, not specifically shown, the density of both the semiconductor substrate 1 and the P-well 2 may be low and a high-density P-type embedded layer may be provided at a predetermined depth of the P-well 2.

Other Modified Examples

In the above described first to fifth embodiments and combinations of the embodiments, and the modified examples 1 to 3, the same effect can be obtained even with opposite conductivity type transistors and protection devices fabricated by replacing the conductivity type of the impurities in the respective parts. The opposite conductivity type transistors and protection devices can be fabricated in the same procedure by reversing the conductivity type of the impurities doped at the respective steps in the above described explanation of the manufacturing methods.

The operation voltage (power supply voltage) of the low-voltage MOSFET (ML) may be any of 1.2 [V], 1.8 [V], 3.3 [V], 5 [V], or the like, and the high-withstand-voltage MOSFET (MH) have a higher withstand voltage than the operation voltage of the constant voltage.

The technical idea of the embodiments of the invention can be applied not only to the planar MOSFET but also to a longitudinal MOSFET structure of LDMOS, DMOS, VMOS, USMOS, or the like.

The technical idea of the embodiments of the invention is not limited to the high-density P-type substrate having the low-density P-type epitaxial layer as the substrate structure, but can be applied to a high-resistance P-type substrate, N-type substrate, SOI substrate, or the like.

The technical idea of the embodiments of the invention is not limited to the device material of Si. In place of Si, other semiconductor materials such as SiGe, SiC, Ge, group-IV semiconductors such as diamond, group III-V semiconductors represented by GaA and InP, group II-VI semiconductors represented by ZnSe and ZnS may be used.

The technical idea of the embodiments of the invention is not limited to the semiconductor integrated circuit. The technical idea may be applied to a discrete semiconductor device. The semiconductor integrated circuit may be arbitrarily used for a logic IC, memory IC, imaging device, or the like.

According to the protection device related to the above described first to fifth embodiments and the modified examples 1 to 3, the junction breakdown occurring due to application of ESD surge is distributed at plural points or broadly generated in a broad region to some degree. Thereby, the concentration of heat generation caused by surge current may be relaxed and breakage of the protection device due to heat generation concentration at snapback may be avoided. Further, while the high drain voltage is maintained, the electrostatistic breakage withstand current comparable to that of a low-voltage protection device can be obtained.

The present application contains subject matter related to that disclosed in Japanese Priority Patent Application JP 2008-310188 filed in the Japan Patent Office on Dec. 4, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A transistor-type protection device comprising:
a semiconductor substrate;
a well of a first-conductivity-type formed in the semiconductor substrate;
a source region of a second-conductivity-type formed in the well;
a gate electrode formed on the well via a gate insulating film at one side of the source region;
plural drain regions of a second-conductivity-type formed apart from each other and respectively separated at a predetermined distance from a well part of the well immediately below the gate insulating film; and
a resistive connection part connecting the plural drain regions with a predetermined electric resistance, wherein the resistive connection part comprises at least one thin-film resistance connected to the respective plural drain regions via a contact part.

2. The transistor-type protection device according to claim 1, wherein the resistive connection part is a second-conductivity-type semiconductor region having a metallurgical junction form and an impurity concentration profile determined so that a region not depleted at application of a drain bias when junction breakdown occurs in one of the plural drain regions remains.

3. The transistor-type protection device according to claim 2, wherein a metallurgical junction depth of the plural drain regions is larger than a metallurgical junction depth of the second-conductivity-type semiconductor region as the resistive connection part.

4. The transistor-type protection device according to claim 1, wherein a well contact region comprising the first-conductivity-type semiconductor at higher density than that of the well is formed in contact with the well at an opposite side to the gate electrode in the source region.

5. The transistor-type protection device according to claim 1, wherein the plural drain regions are formed at substantially a same depth.

6. A transistor-type protection device comprising:
a semiconductor substrate;
a base region of a first-conductivity-type formed in the semiconductor substrate;
an emitter region of a second-conductivity-type formed within the base region;
plural collector regions of a second-conductivity-type formed apart from each other and respectively separated at a predetermined distance from the emitter region; and
a resistive connection part connecting between the plural collector regions with a predetermined electric resistance, wherein the resistive connection part comprises at least one thin-film resistance connected to the respective plural collector regions via a contact part.

7. The transistor-type protection device according to claim 6, wherein the plural collector regions are formed at substantially a same depth.

8. A semiconductor integrated circuit comprising:
a circuit connected to first wiring and second wiring; and
a transistor-type protection device turned on when a potential difference between the first wiring and the second wiring becomes equal to or more than a fixed value and protecting the circuit, the transistor-type protection device comprising:
a semiconductor substrate,
a well of a first-conductivity-type formed in the semiconductor substrate,
a source region of a second-conductivity-type formed in the well,
a gate electrode formed on the well via a gate insulating film at one side of the source region,
plural drain regions of a second-conductivity-type formed apart from each other and respectively separated at a predetermined distance from a well part of the well immediately below the gate insulating film; and
a resistive connection part connecting between the plural drain regions with a predetermined electric resistance, wherein the resistive connection part comprises at least one thin-film resistance connected to the respective plural drain regions via a contact part.

9. The semiconductor integrated circuit according to claim 8, wherein the resistive connection part is a second-conductivity-type semiconductor region having a metallurgical junction form and an impurity concentration profile determined so that a region not depleted at application of a drain bias when junction breakdown occurs in one of the plural drain regions remains.

10. The semiconductor integrated circuit according to claim 8, wherein the plural drain regions are formed at substantially a same depth.

11. A semiconductor integrated circuit comprising:
a circuit connected to first wiring and second wiring; and
a transistor-type protection device turned on when a potential difference between the first wiring and the second wiring becomes equal to or more than a fixed value and protecting the circuit, the transistor-type protection device comprising:
a semiconductor substrate,
a base region of a first-conductivity-type formed in the semiconductor substrate, an emitter region of a second-conductivity-type formed within the base region, plural collector regions of a second-conductivity-type formed apart from each other and respectively separated at a predetermined distance from the emitter region; and a resistive connection part connecting between the plural collector regions with a predetermined electric resistance, wherein the resistive connection part comprises at least one thin-film resistance connected to the respective plural collector regions via a contact part.

12. The semiconductor integrated circuit according to claim 11, wherein the plural collector regions are formed at substantially a same depth.

\* \* \* \* \*